(12) United States Patent
Zhang et al.

(10) Patent No.: US 7,169,657 B2
(45) Date of Patent: Jan. 30, 2007

(54) PROCESS FOR LASER PROCESSING AND APPARATUS FOR USE IN THE SAME

(75) Inventors: Hongyong Zhang, Yamato (JP); Shunpei Yamazaki, Setagaya-ku (JP); Yasuhiko Takemura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 215 days.

(21) Appl. No.: 10/724,126

(22) Filed: Dec. 1, 2003

(65) Prior Publication Data

US 2004/0115940 A1 Jun. 17, 2004

Related U.S. Application Data

(62) Division of application No. 09/356,376, filed on Jul. 19, 1999, now Pat. No. 6,655,767, which is a division of application No. 09/145,543, filed on Sep. 2, 1998, now Pat. No. 6,358,784, which is a division of application No. 08/411,973, filed on Mar. 28, 1995, now Pat. No. 5,849,043, which is a division of application No. 07/971,237, filed on Nov. 4, 1992, now Pat. No. 5,424,244.

(30) Foreign Application Priority Data

| Mar. 26, 1992 | (JP) | ............................. 4-100479 |
| Apr. 1, 1992 | (JP) | ............................. 4-108489 |
| Aug. 12, 1992 | (JP) | ............................. 4-237763 |

(51) Int. Cl.
*H01L 21/50* (2006.01)
*H01L 21/48* (2006.01)
*H01L 21/44* (2006.01)

(52) U.S. Cl. ...................... 438/166; 438/301; 438/308; 438/535

(58) Field of Classification Search ...................... None
See application file for complete search history.

(56) References Cited

U.S. PATENT DOCUMENTS 4,177,372 A 12/1979 Kotera et al.

(Continued)

FOREIGN PATENT DOCUMENTS

| EP | 0 372 821 | 6/1990 |
| JP | 50-117374 | 9/1975 |
| JP | 54-131866 | 10/1979 |

(Continued)

OTHER PUBLICATIONS

X. Tong, et al., "Effect of Si-Substrate Heating During Laser-Induced B-Doping," Appl. Phys. A vol. 59 (Mar. 1994) pp. 189-191.
A Slaoui, et al., "Boron Doping of Silicon by Excimer Laser Irradiataion," J. Appl. Phys. A 50 (1990) pp. 479-484.

(Continued)

*Primary Examiner*—Duy-Vu N Deo
(74) *Attorney, Agent, or Firm*—Eric J. Robinson; Robinson Intellectual Property Law Office, P.C.

(57) ABSTRACT

A process for laser processing an article which comprises: heating the intended article to be doped with an impurity to a temperature not higher than the melting point thereof, said article being made from a material selected from a semiconductor, a metal, an insulator, and a combination thereof; and irradiating a laser beam to the article in a reactive gas atmosphere containing said impurity, thereby allowing the impurity to physically or chemically diffuse into, combine with, or intrude into said article. The present invention also provides an apparatus for use in a laser processing process, characterized by that it is provided with an internal sample holder and a device which functions as a heating means of the sample, a window made of a material sufficiently transparent to transmit a laser beam, a chamber comprising a vacuum evacuation device and a device for introducing a reactive gas containing an impurity element, a laser apparatus operating in a pulsed mode to irradiate a laser beam to said chamber, and a means to move said chamber synchronously with the laser irradiation.

20 Claims, 11 Drawing Sheets

U.S. PATENT DOCUMENTS

| | | | |
|---|---|---|---|
| 4,370,175 A * | 1/1983 | Levatter | 438/57 |
| 4,434,036 A * | 2/1984 | Hoerschelmann et al. | 438/513 |
| 4,436,557 A | 3/1984 | Wood et al. | |
| 4,465,529 A * | 8/1984 | Arima et al. | 438/513 |
| 4,734,550 A | 3/1988 | Imamura et al. | |
| 4,826,711 A | 5/1989 | Yamazaki et al. | |
| 4,851,363 A | 7/1989 | Troxell et al. | |
| 4,859,908 A | 8/1989 | Yoshida et al. | |
| 4,861,729 A * | 8/1989 | Fuse et al. | 438/246 |
| 4,937,205 A * | 6/1990 | Nakayama et al. | 438/513 |
| 4,979,181 A | 12/1990 | Nakanose et al. | |
| 5,017,277 A | 5/1991 | Yoshida et al. | |
| 5,114,834 A | 5/1992 | Nachshon | |
| 5,166,816 A | 11/1992 | Kaneko et al. | |
| 5,174,876 A | 12/1992 | Buchel et al. | |
| 5,205,036 A | 4/1993 | Yamazaki | |
| 5,229,081 A | 7/1993 | Suda | |
| 5,252,498 A | 10/1993 | Yamazaki | |
| 5,270,250 A * | 12/1993 | Murai et al. | 438/513 |
| 5,272,361 A | 12/1993 | Yamazaki | |
| 5,296,405 A | 3/1994 | Yamazaki et al. | |
| 5,313,076 A | 5/1994 | Yamazaki et al. | |
| 5,316,969 A | 5/1994 | Ishida et al. | |
| 5,323,013 A | 6/1994 | Kelly et al. | |
| 5,346,850 A | 9/1994 | Kaschmitter et al. | |
| 5,372,836 A | 12/1994 | Imahashi et al. | |
| 5,424,244 A | 6/1995 | Zhang et al. | |
| 5,485,019 A | 1/1996 | Yamazaki et al. | |
| 5,521,107 A | 5/1996 | Yamazaki et al. | |
| 5,566,009 A | 10/1996 | Yamazaki et al. | |
| 5,583,369 A | 12/1996 | Yamazaki et al. | |
| 5,756,364 A | 5/1998 | Tanaka et al. | |
| 5,766,989 A | 6/1998 | Maegawa et al. | |
| 5,815,494 A | 9/1998 | Yamazaki et al. | |
| 5,849,043 A | 12/1998 | Zhang et al. | |
| 5,854,803 A | 12/1998 | Yamazaki et al. | |
| 5,861,337 A | 1/1999 | Zhang et al. | |
| 5,871,826 A | 2/1999 | Mei et al. | |
| 5,899,547 A | 5/1999 | Yamazaki et al. | |
| 5,938,839 A | 8/1999 | Zhang | |
| 5,946,561 A | 8/1999 | Yamazaki et al. | |
| 6,013,928 A | 1/2000 | Yamazaki et al. | |
| 6,195,139 B1 | 2/2001 | Yamazaki et al. | |
| 6,261,856 B1 | 7/2001 | Shinohara et al. | |
| 6,331,723 B1 | 12/2001 | Yamazaki et al. | |
| 6,358,784 B1 | 3/2002 | Zhang et al. | |
| 2003/0122131 A1 | 7/2003 | Zhang et al. | |
| 2004/0115940 A1 | 6/2004 | Zhang et al. | |

FOREIGN PATENT DOCUMENTS

| | | |
|---|---|---|
| JP | 55-150238 | 11/1980 |
| JP | 56-30721 | 3/1981 |
| JP | 56-080138 | 7/1981 |
| JP | 56-111258 | 9/1981 |
| JP | 57-094482 | 6/1982 |
| JP | 57-162339 | 10/1982 |
| JP | 57-202729 | 12/1982 |
| JP | 58-093273 | 6/1983 |
| JP | 58-103140 | 6/1983 |
| JP | 58-164268 | 9/1983 |
| JP | 60-070722 | 4/1985 |
| JP | 60-170972 | 9/1985 |
| JP | 62-130562 | 6/1987 |
| JP | 62-142370 | 6/1987 |
| JP | 63-208896 | 8/1988 |
| JP | 64-011323 | 1/1989 |
| JP | 64-076715 | 3/1989 |
| JP | 01-101625 | 4/1989 |
| JP | 01-156725 | 6/1989 |
| JP | 01-259530 | 10/1989 |
| JP | 01-260812 | 10/1989 |
| JP | 02-157827 | 6/1990 |
| JP | 02-222154 | 9/1990 |
| JP | 02-222545 | 9/1990 |
| JP | 02-224339 | 9/1990 |
| JP | 02-226732 | 9/1990 |
| JP | 02-234134 | 9/1990 |
| JP | 03-036767 | 2/1991 |
| JP | 03-179778 | 8/1991 |
| JP | 03-280435 | 12/1991 |
| JP | 03-285325 | 12/1991 |
| JP | 03-286518 | 12/1991 |
| JP | 04-011226 | 1/1992 |
| JP | 04-042214 | 2/1992 |
| JP | 05-326430 | 12/1993 |

OTHER PUBLICATIONS

Kawachi et al., "Large Area Doping Process for Fabrication of Poly-Si Thin Film Transistor Using Bucket Ion Source and XeCl Excimer Laser Annealing," Dec. 1990, pp. L2370-2372, Jpn. J. Appl. Phys. 29(12) L2370.

Sameshima et al., "XeCl Excimer Laser Annealing Used to Fabricate Poly-Si TFT's," Oct. 1989, pp. 1789-1793, Japanese J. of Appl. Phys., vol. 28, No. 10.

Semiconductor World, "Excimer Laser Annealing Apparatus," pp. 196-197, Oct. 1, 1992, (with full English translation).

* cited by examiner

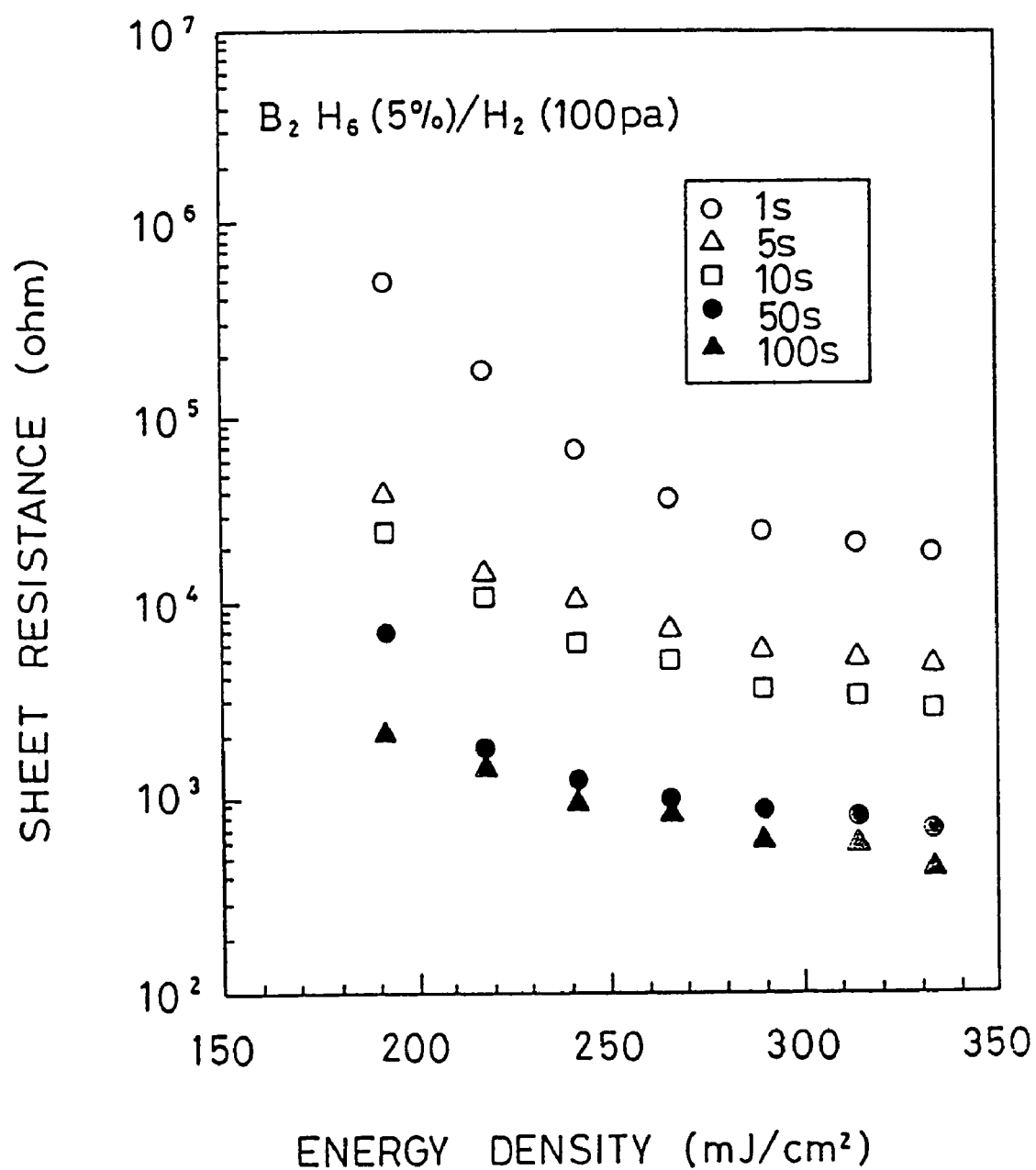

PROCESS FOR LASER PROCESSING AND APPARATUS FOR USE IN THE SAME

This application is a DIV of Ser. No. 09/356,376, filed Jul. 19, 1999, now U.S. Pat. No. 6,655,767, which is a DIV of Ser. No. 09/145,543, filed Sep. 2, 1998, now U.S. Pat. No. 6,358,784, which is a DIV of Ser. No. 08/411,973, filed Mar. 28, 1995, now U.S. Pat. No. 5,849,043, which is a DIV of Ser. No. 07/971,237, filed Nov. 4, 1992, now U.S. Pat. No. 5,424,244.

BACKGROUND OF THE INVENTION

1. Field of the Invention

The present invention relates -to a technique which allows conducting a doping process or other chemical and physical treatments efficiently even at a low temperature.

2. Prior Art

Known processes for doping semiconductors with impurities include a diffusion process and an ion implantation process. The diffusion process comprises heating the semiconductor to a high temperature in the range of from 1000 to 1200° C. to make the impurities diffuse into semiconductors. In an ion implantation process, a predetermined portion of a semiconductor is bombarded with an ionized impurity which has been accelerated in an electric field.

The diffusion coefficient D of an impurity can be expressed with an exponential function of absolute temperature T as $D=D_0 \cdot \exp[-E_a/kT]$, where $D_0$ is the diffusion coefficient at $T=\infty$, $E_a$ is the activation energy, and k is the Boltzmann constant. This equation describes the increase of diffusion coefficient with elevating temperature; accordingly, it has been common practice to carry out diffusion at temperatures as high as possible, preferably, at 1000° C. or higher. In the ion implantation process, on the other hand, it is necessary to activate the impurity and to remove the defects in the crystal lattice damaged by the ion bombardment; i.e., the implantation is followed by high-temperature annealing in the temperature range of from 600 to 950° C.

Recently, some types of active-matrix liquid crystal display devices using a thin-film transistor (TFT) provided on a glass substrate as the switching device have brought into practical use. The source and drain regions in the TFTs of those display devices are, in general, formed monolithically with the ohmic contacts using amorphous silicon having either of the N-type and P-type conductivity. Because the TFT used in this case is of an inverse stagger type, it likely produces a parasitic capacitance ascribed to its structure. To prevent this unwanted capacitance from developing, there has been made studies on making use of a TFT having its source and drain being formed in a self-aligned structure. However, the source and drain can be formed in a self-aligned manner only by the use of an ion implantation or ion shower process. Then again, a post annealing at the temperature range of from 600 to 950° C. should be carried out to activate the impurities and to recover the damage. Taking into consideration that the general purpose economical glass resists only up to a temperature of about 600 to 700° C., those ion implantation and ion shower processes are not feasible in an industrial operation.

As another means to circumvent the problem concerning the recover of thermal damage on the glass substrates, there is known a technology, i.e., impurity doping using a laser beam irradiation. There is known, for example, a process which comprises first covering the intended portion of the surface of the semiconductor with a thin film of the impurity, and then irradiating a laser beam thereto to melt the thin film of the impurity simultaneously with the surface of the semiconductor. In this manner, it is possible to dissolve the impurity into the surface of the molten semiconductor.

In the process above using an excimer laser beam irradiation, the impurity doping can be carried out without causing thermal damage on the glass substrate. However, the process requires an additional step of coating the semiconductor with the impurity. Conventionally, a coating process such as spin coating has been used for this step. However, the quality of this coating is process-determining, because the concentration of the doped impurity depends on the evenness of this coating. Thus, this process is far from being an ideal one. Furthermore, this coating is formed generally using an organic solvent as the solution medium. The use of such an organic solvent sometimes allows unfavorable elements such as carbon, oxygen, and nitrogen to enter into the semiconductor to impair the properties thereof.

In the light of the circumstances described above, the present invention has been achieved with an aim to provide a laser-beam doping technology using particularly an excimer laser, said technology being composed of simplified process steps and free from invasion of foreign elements into the semiconductor during the process. Accordingly, the present invention provides, with an object to simplify the process and to prevent inclusion of undesirable elements, a doping process using a high purity doping material in its gas phase in the place of the conventional solid or liquid phase doping materials. It is another object of the present invention to increase the doping efficiency.

Still other objects of the present invention include doping of elements into, in addition to semiconductors, various types of materials inclusive of insulators and conductors, as well as modifying materials and surfaces thereof. There can be specifically mentioned, for example, doping of phosphorus into a silicon oxide film.

SUMMARY OF THE INVENTION

The present invention provides an impurity doping process for imparting either of the N-type and P-type conductivity to the sample semiconductor, which comprises irradiating a laser beam to the surface of a semiconductor sample in a high purity reactive gas atmosphere containing an impurity which renders the semiconductor N-conductive or P-conductive. It is known, however, based on the acquired knowledge of the present inventors, that the process at temperatures as low as the room temperature is yet to be improved to achieve sufficient diffusion of the elements. In the process of the present invention, the laser beam is irradiated to the semiconductor with the semiconductor being maintained at a temperature higher than room temperature.

An embodiment according to the present invention provides, accordingly, a process which comprises heating the sample and maintaining it to at least 200° C. during the irradiation of a laser beam, thereby accelerating diffusion of the impurity elements and to dope the semiconductor with the impurity at a high concentration. The temperature to which the substrate is to be heated depend on the type of the semiconductor, and is in the range of from 250 to 500° C., preferably from 300 to 400° C., in the case of polysilicon (polycrystalline silicon) and semi-amorphous silicon.

Thus heating the semiconductor is not only advantageous for the diffusion of the impurities, but also the semiconductor itself more readily recovers the temporarily lost high crystallinity due to laser beam irradiation, because heating the sample provides thermally a sufficient relaxation time. A sample without being heated and subjected to an irradiation of a laser beam, particularly to a beam of a laser operating in a pulsed mode, experiences a typical rapid heating and rapid cooling. Hence, such samples are apt to turn into an amorphous state. More specifically, the sample is instantaneously heated to a temperature as high as 1000° C. or even higher, but is then cooled to room temperature during the next period of several hundreds of nanoseconds. If we consider a case in which the sample is silicon and in which the sample is heated to the temperature range above, the time necessary to reach the lower limit of the crystallization temperature, i.e., about 500° C., is calculated to be 10 times as long as that necessary to cool the sample to room temperature. If the duration of laser beam irradiation exceeds a certain duration at this step, the silicon melts to develop a convection which carries the impurities deep into the internal of the silicon. On the other hand, if a pulsed laser beam does not endure for a certain time, the silicon crystallizes into a solid to give a so-called semi-amorphous phase. In this case, the impurities undergoes solid-phase diffusion to enter the internal of the silicon.

It is unfavorable to heat the semiconductor to an excessively high temperature. At too high a temperature, the reactive gas itself undergoes pyrolysis (decomposition by heat) to form deposits not only on the sample but also on the holder and the like. As a result, the efficiency of gas usage may be greatly impaired.

It is also undesirable to maintain the semiconductor at a temperature higher than the crystallization temperature thereof. This is particularly so in the case of semiconductors comprising defects at high density, such as polycrystalline semiconductors, amorphous semiconductors, and semi-amorphous semiconductors. If the doping were to be taken place on a crystalline semiconductor being heated to a temperature of crystallization temperature or higher, the control for valence electrons is almost lost due to the generation of energy levels. Accordingly, it is preferred that the process is conducted by heating the substrate at a temperature not higher than the temperature at which amorphous silicon undergoes thermal transition to polysilicon, i.e., from 500 to 550° C., and more preferably, at a temperature not higher than a temperature lower than the transition temperature by 100° C. (i.e., about 400 to 450° C., or lower). In the case of a TFT using amorphous silicon (referred to hereinafter as a-Si:TFT), the device is destroyed if the temperature exceeds 350° C. Thus, such a-Si:TFTs should be maintained at a temperature lower than 350° C. Such a care should be taken to other semiconductors as well.

Another embodiment according to the process of the present invention provides a technology for doping of an impurity from a gas phase using a laser, particularly an excimer laser, in which a plurality of elements are doped using different types of doping gases. An object of the present process using a single laser beam is to avoid the drop in doping efficiency due to the use of various doping gases differing in light absorption properties and in decomposition behavior. Accordingly, in the present process comprising irradiating a laser beam to the sample in a reactive gas atmosphere containing an impurity which imparts either of the N- and P-conductive types to the semiconductor, an electromagnetic energy is applied to said reactive gas simultaneously with the laser irradiation to thereby decompose the reactive gas. The doping efficiency can be further improved by heating the semiconductor to a pertinent temperature in the same manner as in the first embodiment of the present invention. For example, this heating is carried out at a temperature not higher than the crystallization temperature of the semiconductor under the application of the electromagnetic energy.

BRIEF DESCRIPTION OF THE DRAWINGS

FIG. 15 is a graph in which the change in sheet resistance with varying applied energy density is plotted.

DETAILED DESCRIPTION OF THE INVENTION

Figure 1:
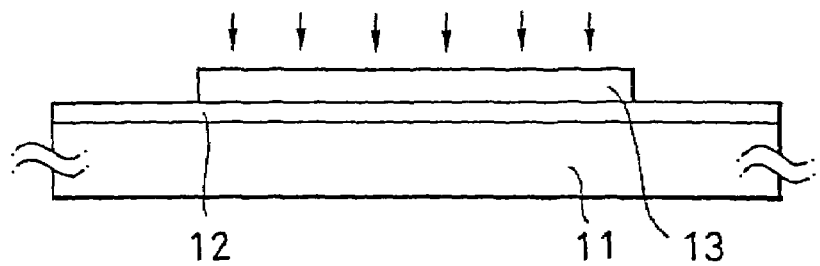
FIG. 1 shows schematically the steps of a process for fabricating a TFT as described in the examples.

In the process according to the present invention, the impurity which imparts either of the N- and P-conductive types to the semiconductor refers specifically to, in the case where a silicon semiconductor is used, a trivalent element, representatively boron (B) and the like, to impart a P-type conductivity; and, a pentavalent impurity, representatively phosphorus (P), arsenic (AS), etc., to impart an N-type conductivity to the silicon semiconductor. Examples of the reactive gases containing those impurities include $AsH_3$, $PH_3$, $BF_3$, $BCl_3$, and $B(CH_3)_3$.

Most commonly used semiconductor for fabricating a TFT is a thin film of an amorphous silicon semiconductor having deposited by a vapor phase process, a sputtering process, etc. Also included are polycrystalline and single crystal silicon semiconductor films prepared from a liquid phase. Needless to say, semiconductors other than silicon can be used as well.

A laser beam having generated from an excimer laser apparatus operating in a pulsed mode is advantageously used. Laser beams in pulses is preferred because the sample can be instantaneously heated, and moreover, selectively heated only on the surface. This is advantageous because the substrate can be left intact. Because heating with a laser is confined to a small area of the sample, the use of a continuously operating laser (such as argon ion laser) sometimes causes the heated portion to fall off from the substrate due to considerable difference in thermal expansion coefficient between the substrate and the sample. In using a laser operating in a pulsed mode, however, this problem can be neglected because the thermal relaxation time is almost negligible as compared with the reaction time of a mechanical stress such as thermal expansion. Thus, the sample can be obtained without suffering any mechanical damage. Of course, there is little diffusion of impurities in the substrate.

What is more advantageous is that the excimer lasers emit ultraviolet (UV) radiations. Because silicon and other semiconductors are good absorbers of UV light, those can efficiently absorb the beam. The duration of a pulse is as short as 10 nsec. Furthermore, we can rely on an excimer laser considering the fact that it has been used in experiments for obtaining thin films of polycrystalline silicon having high crystallinity; the excimer laser has been irradiated on thin films of amorphous silicon for their crystallization. Specific examples of suitable excimer lasers include an ArF excimer laser (emitting light of wavelength 193 nm), a XeCl excimer laser (308 nm), a XeF excimer laser (351 nm), and a KrF excimer laser (248 nm).

In the process according to the present invention, the substrate is heated by using a conductive type holder in which a nichrome alloy wire, a kanthal alloy wire, or another heating element is directly assembled. Also useful are infrared-emitting lamps and any other of a radiation type. However, the temperature of the substrate should be precisely controlled, because the concentration and the depth of the doped impurities are greatly influenced by the temperature of the substrate. Thus, the use of a temperature sensor such as a thermocouple is indispensable for the temperature control of the sample.

In the process according to the present invention, the reactive gas (referred to hereinafter as a "doping gas") for use in doping of impurities is decomposed by applying thereto, in general, a 13.56-MHz high frequency wave energy as an electromagnetic energy. The use of this auxiliary electromagnetic energy enables doping at a high efficiency even when a laser beam which by itself cannot directly decompose the doping gas is used. The electromagnetic energy to use for this purpose need not be only a high frequency wave of 13.56 MHz, and also useful for obtaining a still higher activation ratio is, for example, a microwave at a frequency of 2.45 GHz. Still further, there can be taken advantage of an ECR (electron cyclotron resonance) condition which results from the mutual reaction between a 2.45-GHz microwave and a 875-Gauss magnetic field. It is also effective to use an optical energy which is intense enough to directly decompose the doping gas.

In the foregoing description, a technology for doping of impurities into a semiconductor was referred. The present invention, however, can be applied not only in the specified field above but also in a variety of fields. For example, the present invention can be used in adding a trace element to a metal for a mere several per cent to a portion defined by a certain thickness from the surface, to thereby modify only the surface of the material. More specifically, nitrogen may be added to the surface of iron by conducting the process according to the present invention in ammonia, to obtain a surface comprising iron nitride for a thickness of from several to several hundreds of nanometers.

The present invention can be effectively applied to an oxide as well. For example, the process according to the present invention can be carried out on a thin film of a bismuth-based high temperature oxide superconductor in a lead chloride vapor, thereby adding lead into the oxide superconductor and hence elevate the critical temperature of the superconductor. Several types of bismuth-based oxide superconductors are known to exist, but the highest achieved critical temperature to the present is about 110 K. However, it is difficult to obtain phases having a critical temperature over 100 K. It is known also that the addition of lead into those superconductors readily provides phases with critical temperatures over 100 K, but in a practical process for fabricating thin films, lead tends to dissipate outside the oxide due to the heat from the substrate. In the process according to the present invention, however, the reaction takes place in disequilibrium. Hence, lead can be effectively incorporated into the material having deposited into a thin film. Similarly, the process can be applied to a lead-containing ferroelectric, PZT (lead zirconate titanate), which is now gaining much attention as a functional material for semiconductor integrated circuits, more particularly, for semiconductor memories.

The process according to the present invention can be used further for adding trace impurities into an insulator such as silicon oxide. Silicon oxide is frequently used as phosphosilicate glass (PSG) by adding several per cent of phosphorus therein, as is customary in the conventional fabrication processes for semiconductors. Thus, phosphorus can be added to silicon oxide using the process according to the present invention; for example, phosphorus may be added to silicon oxide and diffused therein at a concentration of from $1 \times 10^{20}$ to $3 \times 10^{20}$ cm$^{-3}$.

The phosphosilicate glass is known for its ability of preventing movable ions such as sodium from invading the internal of the semiconductor. In a conventional process, the phosphosilicate glass is deposited as a film in an isolated CVD (chemical vapor deposition) chamber designed specially for PSGs. The installation of such a CVD chamber requires an additional cost. In contrast, the steps of doping of impurities and depositing phosphosilicate glass can be performed in a single apparatus for laser doping. Moreover, the film deposition apparatus for silicon oxide can be used widely in other applications. Accordingly, the total cost can be reduced, and hence, it can be seen that the process is economical.

In particular, the process according to the present invention is effective for improving film properties of the silicon oxide film having deposited at a relatively low substrate temperature of 600° C. or lower, using various types of organosilane compounds (e.g., tetraethoxysilane (TEOS)) as the starting material by vapor phase reaction. The process for doping the silicon oxide film comprises irradiating a laser beam to the surface of the silicon oxide film in a gas atmosphere containing phosphorus. In general, conventional films of this type contain considerable amount of carbon which impair the insulating properties; moreover, those films had too many trap levels to be used as insulator films for MOS structures and the like.

However, the film obtained by the process according to the present invention results in a considerably reduced amount of trap levels and in an improved insulating property. This is because carbon is driven away from the film by the heat having generated by the laser irradiation. As explained hereinbefore, the distribution of the impurities along the depth direction of the substrate can be controlled by changing the temperature of the substrate. Accordingly, if a silicon oxide film containing phosphorus deeply distributed therein is desired, the substrate is maintained at a temperature of 200° C. or higher, and preferably, in the range of from 350 to 450° C. If a silicon oxide film having phosphorus distributed within 100-nm depth or shallower, the substrate is maintained at a room temperature or lower.

If another semiconductor material such as amorphous silicon is provided under the silicon oxide film at the laser doping, the crystallinity thereof is also improved at the same time by annealing. This occurs because a silicon oxide film has low absorbance of UV light, and hence, the UV radiation having transmitted through the film is absorbed by the semiconductor material lying underneath the silicon oxide film. This signifies that two steps can be put simultaneously in progress, and that the process according to the present invention is useful for enhancing mass-productivity.

Figure 5:
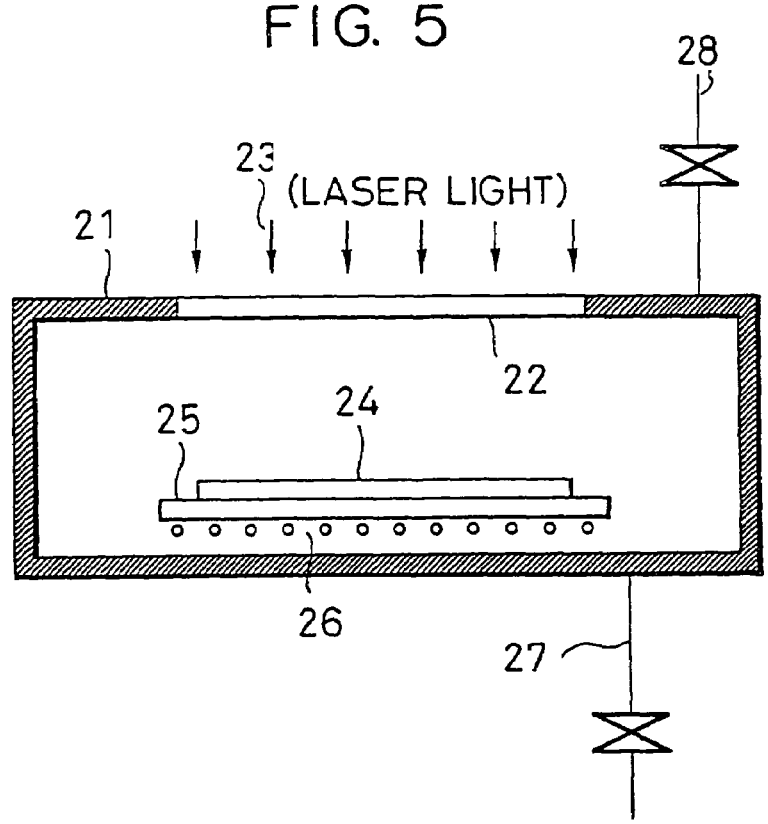
FIG. 5 shows a schematically drawn apparatus used in Example 1, used for processing (impurity-doping) semiconductors.
Figure 6:
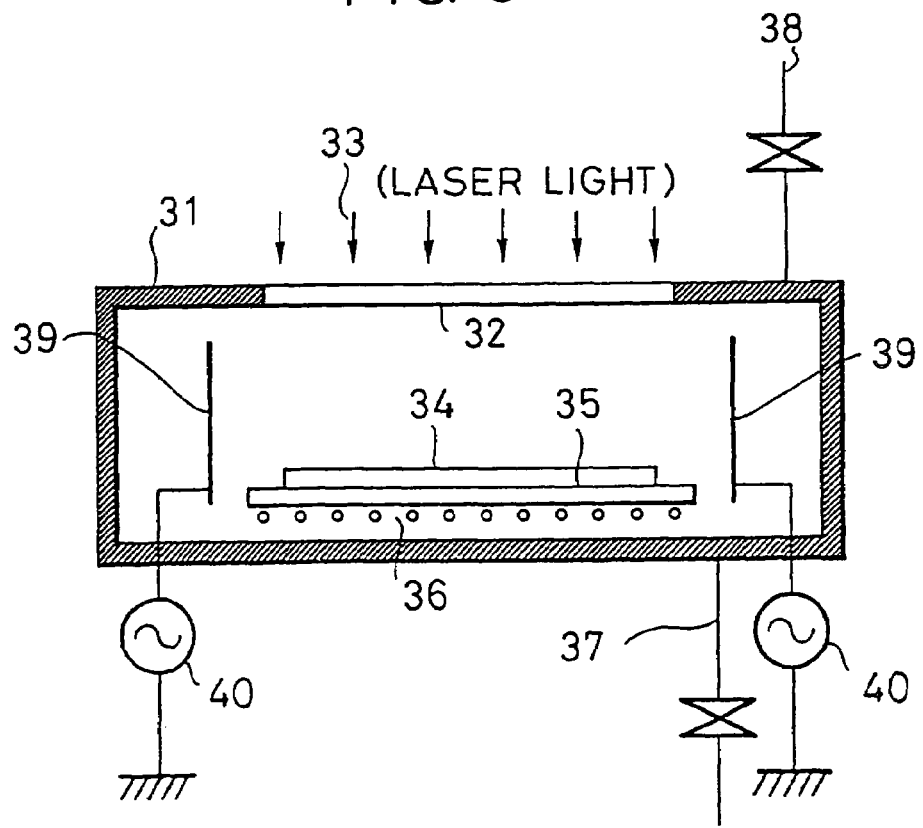
FIG. 6 shows another schematically drawn apparatus used in Example 2, used for processing (impurity-doping) semiconductors.

In FIGS. 5 and 6 are shown schematically the apparatuses according to the present invention. The apparatus illustrated in FIG. 5 is equipped only with a substrate heating device (sample heating device), and that in FIG. 6 comprises, in addition to the device above, an electromagnetic device for generating a plasma. It should be noted that the figures are intended only for explanatory use, and in the practical operation of those apparatuses, they must be implemented with other parts if necessary. The mode of usage of those apparatuses is described below.

Referring to FIG. 5, explanation is made first on the apparatus shown therein. A sample 24 is mounted on a sample holder 25. First, a chamber 21 is evacuated using an evacuation system 27 which is connected to an evacuation apparatus. This step is conducted because the atmospheric components such as carbon, nitrogen and oxygen are least desirable for semiconductors. Those elements are easily incorporated into the semiconductor to sometimes lower the activity of the intentionally added impurities. Furthermore, they also impair the crystallinity of the semiconductor and are causes of the formation of dangling bonds. Thus, the chamber is preferably evacuated first to a vacuum of $10^{-6}$ Torr or lower, and preferably, to $10^{-8}$ Torr or lower.

It is also favorable to drive out the atmospheric components having adsorbed inside the chamber by operating a heater 26, together with, slightly before, or slightly after the evacuation. A structure, as is commonly seen in a present-day vacuum apparatus, is preferred that a pre-chamber is separately provided outside the chamber, because the chamber can be isolated from the atmosphere. As a matter of course, the use of turbo molecular pumps and cryo-pumps which cause less carbon contamination and the like is preferred to rotary pumps and oil-diffusion pumps.

After once the chamber is sufficiently evacuated, a reactive gas containing an impurity element is introduced into the chamber through a gas system 28. The reactive gas may be a single component gas, or such diluted with hydrogen, argon, helium, neon, etc. It may be controlled to an atmospheric pressure or lower. These conditions are selected in view of the type of the semiconductor to be processed, the concentration of the impurity, the depth of the impurity region, the temperature of the substrate, and the like.

Then, a laser beam 23 is irradiated through a window 22 from a laser device. At this instance, the sample is heated to a constant temperature using a heater. The laser beam is irradiated, in general, from about 5 to 50 pulses per one site. Because the energy per pulse of the laser beam considerably fluctuates, too few a repetition leads to the production of undesirable products at a high possibility. On the other hand, too many a pulse repetition per site is also undesirable from the viewpoint of throughput. From the acquired knowledge of the present inventors, a pulse repetition of from about 5 to 50 per site is optimal from the viewpoint of throughput and product yield.

In irradiating a laser beam having a particular shape, for example, a 10 mm (along x direction)×30 mm (along y direction)-rectangle, the beam can be irradiated in a pulse repetition of 10 times per site and then it can be moved to the next site. Otherwise, the beam position can be moved 1 mm each time along the x direction with the repetition of the pulse.

Upon completion of the laser irradiation step, the interior of the chamber is evacuated to vacuum, and the sample is taken out of the chamber after sufficiently cooling it to room temperature. It can be seen that the doping step is quite easily performed, and yet rapid. This can be seen in clear contrast with a conventional ion implantation process which comprises three steps, i.e., (1) forming a doping pattern, which comprises coating the semiconductor with a resist, exposing, and developing; (2) conducting ion implantation (or ion doping); and (3) recrystallizing the resulting semiconductor; or with a conventional solid phase diffusion process which comprises also three steps, i.e., (1) forming a doping pattern, which comprises coating the semiconductor with a resist, exposing, and developing; (2) coating the resulting structure with an impurity film (by spin-coating, etc.); and (3) irradiating laser beam to the resulting structure. The process according to the present invention can be accomplished in two steps, i.e., (1) forming a doping pattern, which comprises coating the semiconductor with a resist, exposing, and developing; and (2) irradiating a laser beam to the resulting structure.

A description similar to that given for the apparatus shown in FIG. 5 can be applied to the one illustrated in FIG. 6. Firstly, a chamber 31 is evacuated to vacuum through an evacuation system 37, and then a reactive gas is introduced therein through a gas system 38. Then, a laser beam 33 is irradiated to a sample 34 having mounted on a sample holder 35 through a window 32. At this instance, an electric power is applied from a high frequency or an AC (or DC) power source 40 to an electrode 39 to thereby generate a plasma and the like inside the chamber to activate the gas. The electrode in the figure is illustrated as a capacitance coupling type, but an inductance coupling type may be used in its place without any problem. Furthermore, even if a capacitance coupling type were to be used, the sample holder may be used as the counter electrode. The sample may be heated with a heater 36 during irradiating thereto a laser beam.

The present invention is described in further detail below referring to some non-limiting examples.

EXAMPLE 1

An N-channel thin film gate-insulated field-effect transistor (referred to hereinafter as "NTFT") established on a glass substrate was fabricated according to a doping process of the present invention. A glass substrate or a quartz substrate was used in this example. Such substrates were selected because the TFTs thus fabricated were intended for switching devices and driving devices of an active matrix liquid crystal display device or an image sensor. The process according to the present invention can be used as a doping technology in the fabrication of other semiconductor devices as well, such as the fabrication of P-type and N-type semiconductor layers of a photoelectric conversion devices, and the fabrication of single crystal semiconductor integrated circuits (ICs). In such cases, single crystal and polycrystalline substrates of silicon and other semiconductors can be used as well as other insulators.

Referring to FIG. 1, the fabrication process is described. An $SiO_2$ film or a silicon nitride film was first deposited on a glass substrate 11 to give a base protective film. In the present example, a 200 nm thick $SiO_2$ film was deposited by RF sputtering in a 100% oxygen atmosphere under conditions as follows.

Oxygen flow rate 50 sccm
Pressure 0.5 Pa
RF power 500 W
Substrate temperature 150° C.

Then, a 100 nm thick layer 13 of hydrogenated amorphous silicon semiconductor, which is intrinsic semiconductor or substantially intrinsic (without artificially adding any impurity), was deposited on the $SiO_2$ film by plasma-assisted CVD process. This layer 13 of hydrogenated amorphous silicon semiconductor serves as a semiconductor layer which provides a channel forming region and source and drain regions. The film deposition was conducted under conditions as follows.

Atmosphere 100% silane ($SiH_4$)
Film deposition temperature(substrate temperature) 160° C.
Pressure at film deposition 0.05 Torr
Input power 20 W (13.56 MHz)

In the present process, silane was used as the starting material for depositing amorphous silicon. However, if the amorphous silicon is to be thermally crystallized into a polycrystalline silicon, disilane or trisilane may be used as alternatives to silane to lower the crystallization temperature.

The film deposition in this case was conducted in 100% silane instead of carrying out the process in a generally employed hydrogen-diluted silane atmosphere. This was based on experimental results which showed that the amorphous silicon film having deposited in 100% silane can be more easily crystallized as compared with a one having deposited in a hydrogen-diluted silane. The film deposition was conducted at a low temperature in this case to incorporate a large amount of hydrogen into the amorphous silicon film. In this manner, as many bondings as possible can be neutralized with hydrogen.

Furthermore, the input power of the high frequency wave energy (13.56 MHz) in this example was as low as 20 W. By thus lowering the input power, the formation of silicon clusters, i.e., partially crystalline portion, during the film deposition can be avoided. This condition was selected also based on the previous findings acquired through experiments. That is, the incorporation of a small crystalline portion into the amorphous silicon film unfavorably affects the later crystallization of the film which is conducted by irradiating a laser beam.

Then, a patterning was carried out to separate the films into devices to obtain a structure as shown in FIG. 1. Subsequent to the patterning, the sample was heated in vacuum (of $10^{-6}$ Torr or lower) at 450° C. for an hour to thoroughly drive out hydrogen therefrom to form dangling bonds in high density.

The sample thus obtained was transferred into a laser irradiation apparatus as shown in FIG. 5, and was subjected to irradiation of an excimer laser beam. In this manner the sample was crystallized into polycrystalline silicon. In this step, a KrF excimer laser emitting a light at a wavelength of 248 nm was operated at a laser beam irradiating energy density of 350 mJ/cm² on a substrate heated to 400° C. The pulsed laser beam was applied from 1 to 10 shots per site.

After the laser irradiation step, the sample was cooled to 100° C. in a hydrogen atmosphere under a reduced pressure of about 1 Torr.

In the present example, the crystallization of the amorphous silicon film was performed by irradiating a laser beam thereon. Alternatively, a heating process may be used for the crystallization of an amorphous silicon semiconductor film provided on a glass substrate as well. A heating process in this case comprises heating the sample at a temperature not higher than the heat-resistant temperature of the glass, specifically, in a temperature range of from 450 to 700° C. (in general, at 600° C.) for 6 to 96 hours.

In FIG. 5 is shown an apparatus comprising a vacuum chamber 21, a quartz (anhydrous quartz is preferred particularly in the case of excimer laser) window 22 through which a laser beam is irradiated to the sample from the outside of the vacuum chamber 21, a laser beam 23 to irradiate the sample, a sample 24, a sample holder 25, a heater 26 for heating the sample, an evacuation system 27, and an inlet system 28 for a gas of the starting material, an inert gas, and a carrier gas. A practical apparatus is generally equipped with a plurality of inlet systems, but in the figure is shown only one of those. In this example, a rotary pump and a turbo-molecular pump were connected to the evacuation system to achieve a lower vacuum and a higher vacuum, respectively. By appropriately using these two pumps, the concentration of the residual impurities (particularly oxygen) was reduced to a level as low as possible. The pumps to be used herein must be able to achieve a vacuum of $10^{-6}$ Torr or lower, and preferably, a vacuum of $10^{-8}$ Torr or lower.

Figure 2:
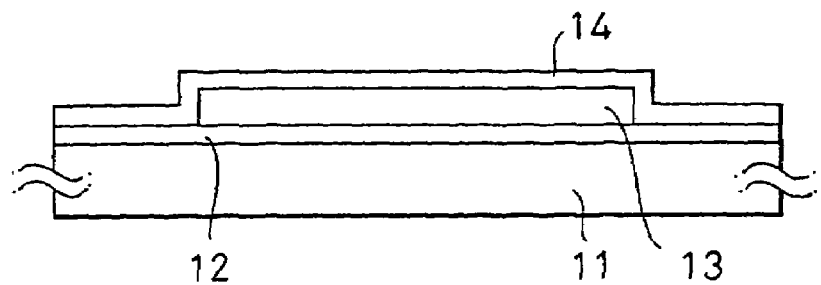
FIG. 2 shows schematically the steps of a process for fabricating a TFT as described in the examples.
Figure 3:
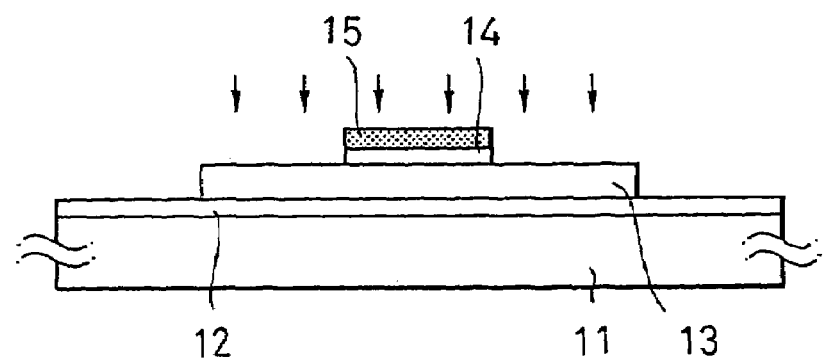
FIG. 3 shows schematically the steps of a process for fabricating a TFT as described in the examples.

After conducting the crystallization of the silicon film by operating an excimer laser in a vacuum chamber, a 100 nm thick $SiO_2$ film 14 as a gate insulator was deposited on the resulting structure by RF sputtering. Thus was obtained a structure shown in FIG. 2. Then, a 150 nm thick amorphous silicon semiconductor layer or polycrystalline silicon semiconductor layer was deposited to give a gate electrode 15 on the gate insulating film 14. This layer was deposited incorporating P (phosphorus) to render the layer N-conductive. A structure as shown in FIG. 3 was thus obtained by patterning out a gate region. The gate electrode may otherwise comprise a metal, such as aluminum, chromium, and tantalum. If aluminum or tantalum were to be used, the surface thereof should be anodically oxidized to prevent the gate electrode from suffering damage at the later step of laser irradiation. For a planar type TFT comprising an anodically oxidized gate electrode, reference should be made to Japanese patent application Hei-3-237100 or Hei-3-238713.

Then, to the structure as shown in FIG. 3, impurities were doped using a laser beam again in an apparatus shown in FIG. 5, in accordance with the process of the present invention. The sample placed inside the apparatus shown in FIG. 5 was heated under a $PH_3$ atmosphere, and a laser beam was irradiated thereto to carry out doping of P (phosphorus). Accordingly, the source and drain regions (131 and 133 in FIG. 4) were rendered N-conductive because the source and drain regions were doped with the impurity P (phosphorus). The channel-forming region (132 in FIG. 4), however, remained undoped because the gate insulator film 14 and the gate electrode 15 functioned as a mask to cut off laser beam irradiation. In FIG. 3, the channel region is located between the source and drain regions under the gate electrode in the semiconductor 13. The doping was carried out under conditions as follows.

Atmosphere 5% $PH_3$ (diluted with $H_2$)
Sample temperature 350° C.
Pressure 0.02–1.00 Torr
Laser used KrF excimer laser (emitting light of 248 nm wavelength)
Energy density 150–350 $mJ/cm^2$
Pulse repetition 10 shots The source and drain regions can be activated simultaneously with the laser doping.

Figure 4:
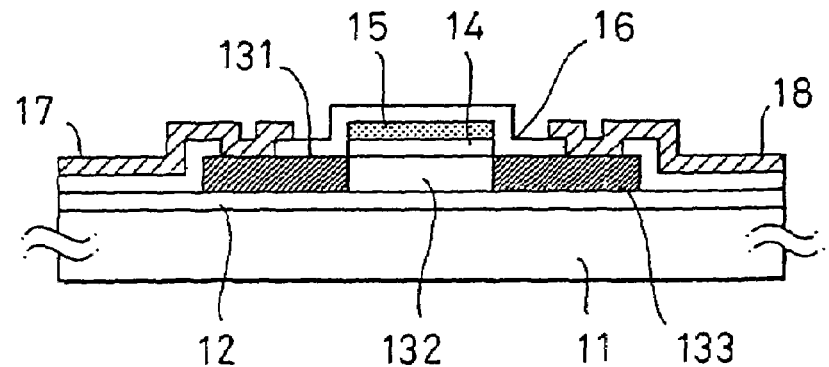
FIG. 4 shows schematically the steps of a process for fabricating a TFT as described in the examples.

After establishing the source and drain regions above, a 100 nm thick $SiO_2$ film 16 was deposited as an insulator film by RF sputtering as shown in FIG. 4. The film deposition conditions were the same as those employed in the film deposition of the gate insulator.

In the next step, contact holes were provided by patterning, and further, aluminum was vapor deposited to establish a source electrode 17 and a drain electrode 18. The resulting structure was thermally annealed at 350° C. in hydrogen to finish it into an NTFT. A P-channel TFT (a "PTFT", hereinafter) could be fabricated similarly by using $B_2H_6$ in the place of $PH_3$.

Figure 9:
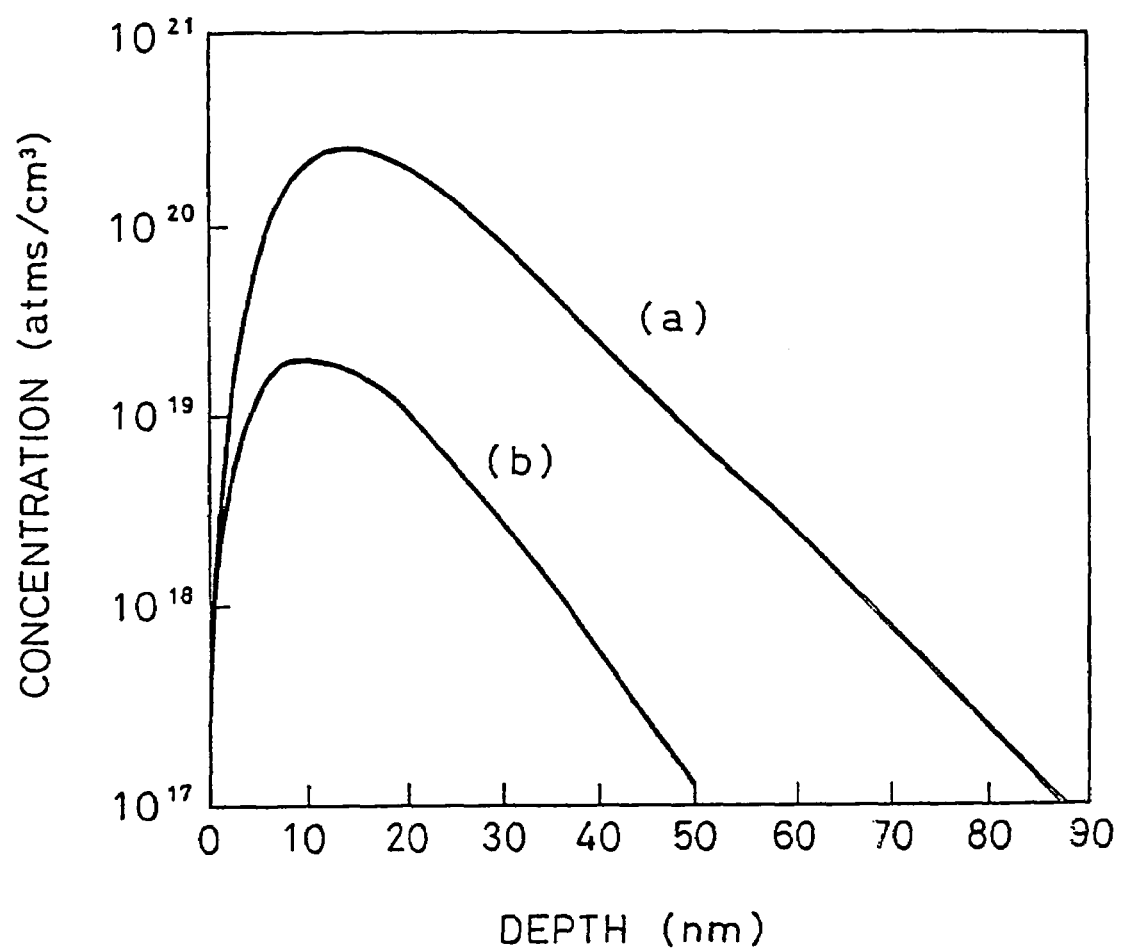
FIG. 9 is a graph showing the distribution of impurity regions in semiconductors having fabricated by a conventional process and a process according to the present invention.

Furthermore, to assure the effect of the present invention, a sample was prepared without heating it during irradiating a laser beam thereto, at the same laser beam intensity as used in the process according to the present invention. The result is shown in FIG. 9(b). It can be seen clearly from these curves that the impurity concentration of a sample fabricated without heating the sample remained more than an order of degree lower, and the impurities were confined to the vicinity of the surface. In contrast, the sample fabricated by heating it to 350° C. during the laser beam irradiation was found to contain the impurities at a high concentration and to have the impurities being diffused deep into the sample as shown in FIG. 9(a).

Figure 16A:
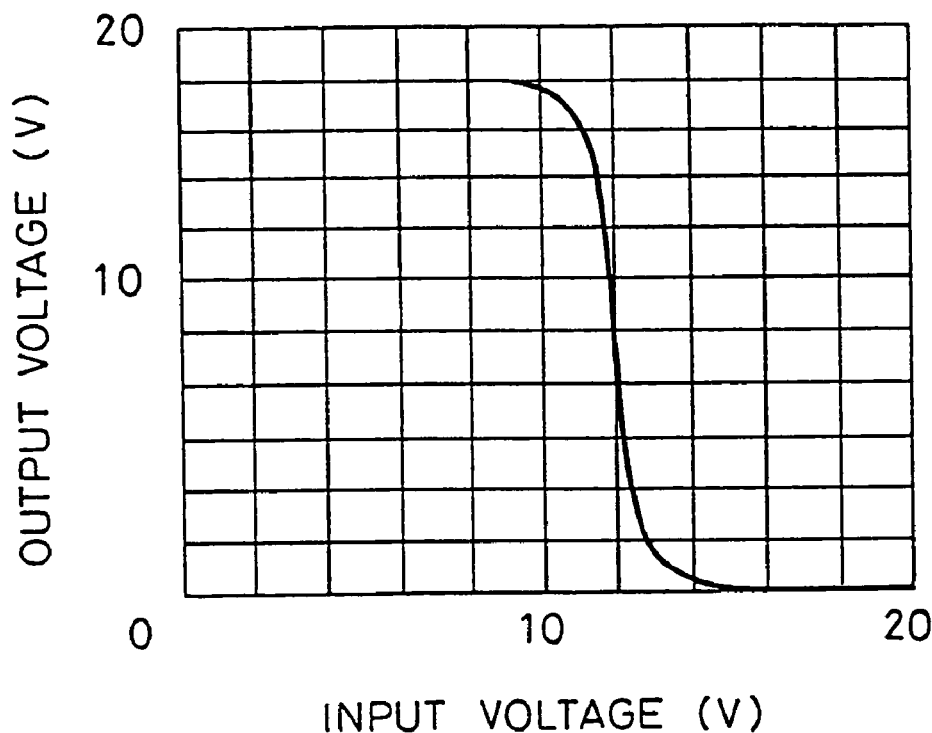
FIGS. 16(A)–(B) give the characteristic curves for an inverter and a ring oscillator having fabricated by a process according to the present invention.
Figure 16B:
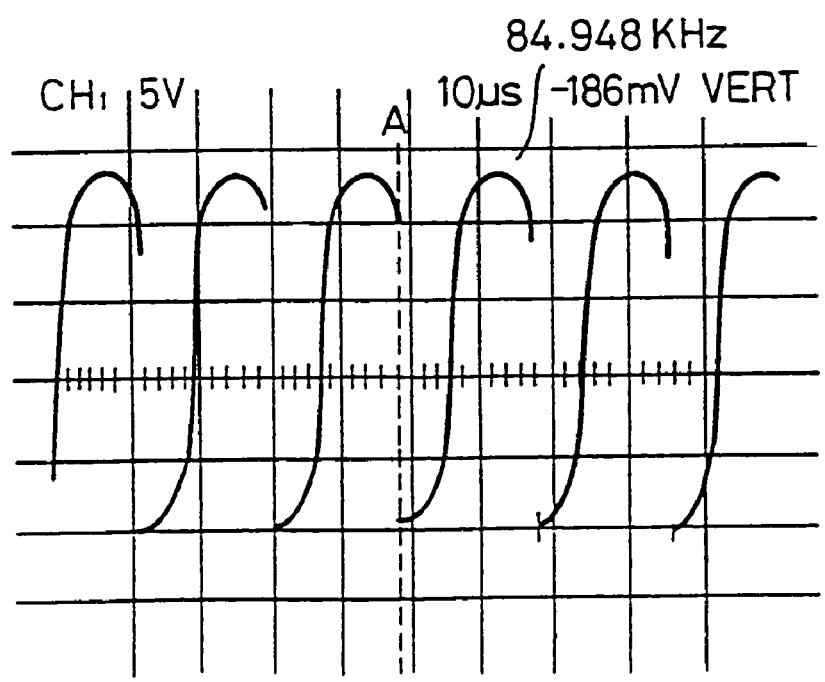

As described in the foregoing, both an NTFT and a PTFT were fabricated according to the process of the present invention. These TFTs were further assembled into a CMOS inverter, which was found to have excellent characteristics as shown in FIG. 16 (upper). Furthermore, a plurality of these CMOS circuits were assembled into a ring oscillator, which was also found to yield excellent characteristics as shown in FIG. 16 (lower).

EXAMPLE 2

An NTFT established on a glass substrate was fabricated according to a doping process of the present invention. A glass substrate or a quartz substrate was used in this example as in Example 1. Then, an $SiO_2$ film or a silicon nitride film was first deposited on a glass substrate 11 to give a base protective film 12 as shown in FIG. 1, following the same process described in Example 1.

Then, a 100 nm thick layer 13 of hydrogenated amorphous silicon semiconductor, which is intrinsic semiconductor or substantially intrinsic, was deposited on the $SiO_2$ film by plasma-assisted CVD process. A patterning process was then carried out to separate the film into devices to obtain a structure as shown in FIG. 1. Subsequent to the patterning, the sample was heated in vacuum (of $10^{-6}$ Torr or lower) at 450° C. for an hour to thoroughly drive out hydrogen therefrom to form dangling bonds in high density.

In the same chamber in which the process of driving out hydrogen was performed, the sample thus obtained was subjected to irradiation of an excimer laser beam while maintaining the vacuum. In this manner, the sample was crystallized into polycrystalline silicon under the same conditions as those used in the process of Example 1. After the laser irradiation, the sample was cooled to 100° C. in a hydrogen atmosphere under a reduced pressure of about 1 Torr.

In the present example, an apparatus as shown in FIG. 6 was used throughout the processes of heating the sample for removing hydrogen, crystallization of the sample by laser beam irradiation, and doping of impurities into the sample. Those processes were performed in the same single vacuum chamber. This is advantageous in that the sample can be easily maintained in high vacuum throughout the processes and that thereby the film can be maintained free from impurities (particularly oxygen). The vacuum chamber can be used as a plasma-assisted CVD apparatus, as is equipped with an electrode for applying an electromagnetic energy to the atmosphere. However, the processes above may be carried out separately in different reaction furnaces by using an apparatus having a multi-chamber arrangement. The reaction furnace in this example had a positive column structure, but the structure of the useful furnaces is not only limited thereto, and furnaces having other types of structures may be used as well. The manner of applying an electromagnetic energy also is not particularly limited. An ECR type apparatus may be used to achieve a further high activation ratio on the samples.

In FIG. 6 is shown an apparatus comprising a vacuum chamber 31, a quartz window 32 through which a laser beam is irradiated to the sample from the outside of the vacuum chamber 31, a laser beam 33 to irradiate the sample, a sample 34, a sample holder 35, a heater 36 for heating the sample, an evacuation system 37, and an inlet system 38 for supplying a gas of the starting material, an inert gas, and a carrier gas. A practical apparatus is generally equipped with a plurality of inlet systems, but in the figure is shown only one of these. In this example, a rotary pump and a turbomolecular pump were connected to the evacuation system to achieve a lower vacuum and a higher vacuum, respectively. An electromagnetic energy of 13.56 MHz which is generated by a high frequency wave generator 40 is supplied to the chamber by a pair of parallel planar electrodes 39.

After conducting the crystallization of the silicon film by operating an excimer laser in a vacuum chamber as shown in FIG. 6, a 100 nm thick $SiO_2$ film 14 as a gate insulator was deposited on the resulting structure by RF sputtering. Thus was obtained a structure shown in FIG. 2. Then, a 150 nm thick amorphous silicon semiconductor layer or polycrystalline silicon semiconductor layer was deposited to give a gate electrode 15. This layer was deposited incorporating P (phosphorus) to render the layer N-conductive. A structure as shown in FIG. 3 was thus obtained by patterning out a gate region.

Then, to the structure as shown in FIG. 3, impurities were doped using a laser beam again in an apparatus shown in FIG. 6, in accordance with the process of the present invention. The sample placed inside the apparatus shown in FIG. 6 was heated under a $PH_3$ atmosphere being decomposed by the applied electromagnetic energy, and a laser beam was irradiated thereto to dope the sample with P (phosphorus). Accordingly, the source and drain regions (131 and 133 in FIG. 4) were rendered N-conductive because P was doped. The channel-forming region (132 in FIG. 4), however, remained undoped because the gate insulator film 14 and the gate electrode 15 functioned as a mask to cut off laser beam irradiation. The doping was carried out under conditions as follows.

Atmosphere 5% $PH_3$ (diluted with $H_2$)
Sample temperature 350° C.
Pressure 0.02–1.00 Torr
Input energy 50–200 W
Laser used KrF excimer laser (emitting light of 248 nm wavelength)
Energy density 150–350 mJ/cm$^2$
Pulse repetition 10 shots After establishing the source and drain regions above, a 100 nm thick $SiO_2$ film 16 was deposited as an insulator film by RF sputtering. The film deposition conditions were the same as those employed in Example 1. In the next step, contact holes were provided by patterning, and further, aluminum was vapor deposited to establish a source electrode 17 and a drain electrode 18. The resulting structure was thermally annealed at 350° C. in hydrogen to finish it into an NTFT.

A P-channel TFT (a "PTFT", hereinafter) could be fabricated similarly by this doping process, except for using $B_2H_6$ in the place of $PH_3$. In conventional processes, the mixture of gases is decomposed heterogeneously upon irradiation of a laser beam at a single wavelength depending on the differing decomposition degree of each of the component gases. The conventional processes thus suffered problematic non-uniform doping. However, the process according to the present invention is free from being non-uniformly doped, because the doping gas in this process is decomposed not by the laser beam but by an additionally applied electromagnetic energy. Thus, uniform doping was achieved in both PTFT and NTFT without being influenced by the wavelength of the applied laser beam.

EXAMPLE 3

Figure 7:
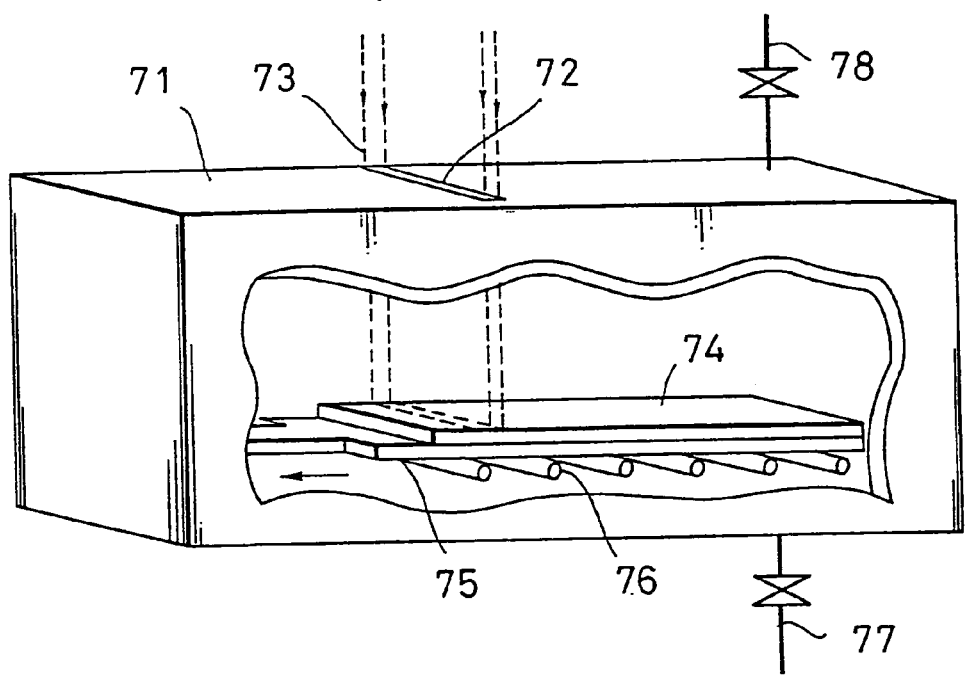
FIG. 7 shows another schematically drawn apparatus used in Example 3, used for processing (impurity-doping) semiconductors.

In FIG. 7 is shown a doping apparatus according to the present invention, which comprises a chamber 71 provided with an anhydrous quartz slit window 72 through which a laser beam shaped into a thin rectangular form is irradiated to the sample. This laser beam is shaped, for example, into a rectangle 10 mm by 300 mm in size. The position of the laser beam is fixed. To the chamber are further connected an evacuation system 77 and an inlet system 78 for supplying the reactive gas. In the inside of the chamber are provided a sample holder 75 on which a sample 74 is mounted, and an infrared-emitting lamp 76 as a heater is set under the sample holder. The sample holder is movable so that the sample may be moved in accordance with the laser shots.

An apparatus equipped with a mechanism for moving the sample therein requires much care in its temperature control, because the mechanism may suffer mal-alignment due to dimensional change thereof caused by the heat generated by the heater. Furthermore, the chamber is a subject of frequent and troublesome maintenance work because the mechanism for moving the sample generates much dust.

EXAMPLE 4

Figure 8A:
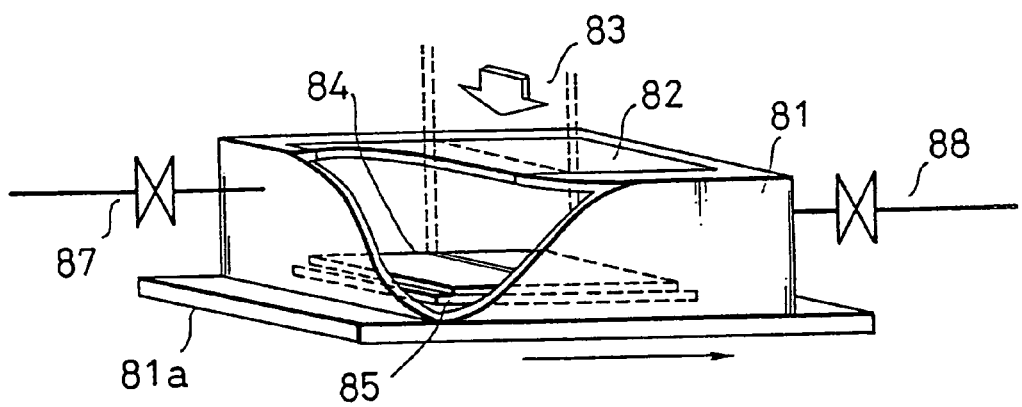
FIGS. 8(A)–8(B) show another schematically drawn apparatus used in Example 4, used for processing (impurity-doping) semiconductors.

In FIG. 8(A) is shown a doping apparatus according to the present invention, which comprises a chamber 81 provided with an anhydrous quartz window 82 sufficiently transparent to transmit a laser beam. Dissimilar to the window provided to the apparatus used in Example 3, it is a wide one which can cover the whole sample 84. To the chamber are connected a vacuum evacuation system 87 and an inlet system 88 for supplying the reactive gas (a gas containing an impurity element). In the inside of the chamber are provided a sample holder 85 on which a sample 84 is mounted, and the sample holder is equipped with an internal heater which functions as a heating means of the sample. The sample holder is fixed to the chamber. To the lower portion of the chamber is provided a table 81a for the chamber so that the whole chamber may be moved in accordance with the laser shots. The laser beam used in this Example was also shaped into a narrow rectangle as the one used in Example 3. For example, a laser beam shaped into a rectangle of 5 mm×100 mm in size was used. Similarly again to the laser beam used in Example 3, the position of the beam was fixed. The apparatus used in this Example is different from that of Example 3 in that it employs a mechanism to make the whole chamber movable. Thus, the inner of the chamber is free from those mechanical parts and hence generates no dust. By arranging the apparatus in this way, much effort for maintenance work can be saved. Furthermore, the transport mechanism is independent of the heat generated from the heater.

Figure 8B:
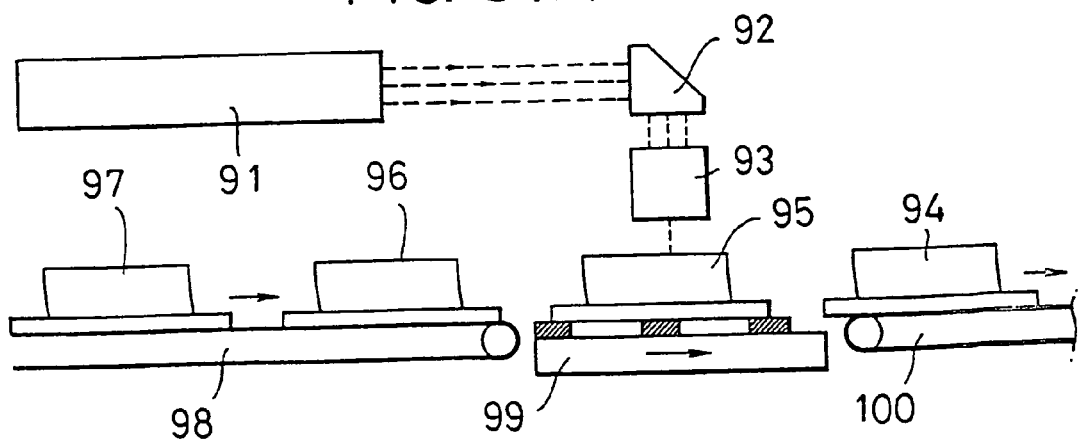

The apparatus in the present Example is advantageous not only in the points mentioned hereinbefore, but also in the points as follows. The apparatus used in Example 3 requires a long dead time, i.e., it took a long time to get the laser fired after once a sample was loaded into the vacuum chamber, because a sufficient vacuum degree should be attained by evacuation. In the apparatus of the present Example, a plurality of chambers (at least two chambers) as shown in FIG. 8(A) are provided so that they may be rotated to perform sequentially the steps of charging the sample, evacuating the chamber to vacuum, irradiating a laser beam to the sample, and taking out the sample from the chamber. In this manner, dead time can be completely eliminated from the process. In FIG. 8(b) is shown a system employing the arrangement mentioned above.

In this system, chambers 96 and 97 charged with non-treated samples are transferred during the evacuation step by a continuously moving transportation mechanism 98 to a table 99 equipped with a precision stage. The chamber 95 being mounted on the stage contains a sample therein, and a laser beam having generated by a laser device 91 operating in a pulsed mode and processed by pertinent optical devices 92 and 93 is irradiated to the sample. After the sample is subjected to the desired laser beam irradiation treatment by moving the stage and the chamber 95 synchronously with the laser irradiation, the chamber 94 is transferred to the next step again by a continuously moving transportation mechanism 100. During this transportation step, the heater inside the chamber is turned off and the chamber is evacuated to get ready to take out the sample after it is sufficiently cooled.

As was described in the foregoing, the apparatus used in the present Example cuts off the waiting time for being evacuated, and hence the throughput can be increased. It should be noted, however, that this process provides an increased throughput, but it requires many chambers to be installed. Hence, the apparatus must be chosen by taking into consideration the scale of mass production and of cost.

EXAMPLE 5

Figure 10A:
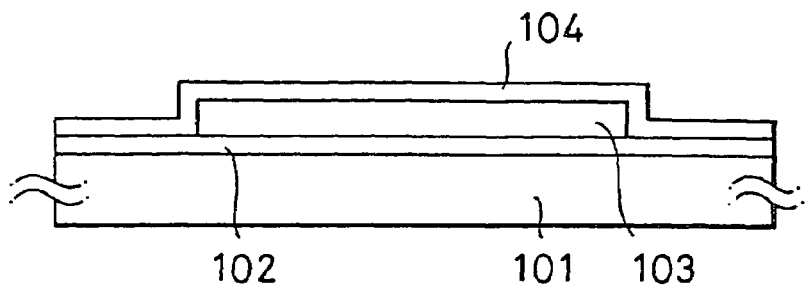
FIGS. 10(A)–10(C) show schematically the steps of a process for fabricating a TFT as in Example 5.

An NTFT established on a glass substrate was fabricated according to a doping process of the present invention. A glass substrate or a quartz substrate was used in this example as in Example 1. Then, an $SiO_2$ film was first deposited on a glass substrate 101 to give a base protective film 102 as shown in FIG. 1, following the same process described in Example 1. Then, a 100 nm thick layer 103 of hydrogenated amorphous silicon semiconductor, which is substantially intrinsic, was deposited on the $SiO_2$ film by plasma-assisted CVD process. A patterning process was then carried out to separate the film into devices to obtain a structure as shown in FIG. 1. Subsequent to the patterning, the sample was heated in vacuum (of $10^{-6}$ Torr or lower) at 450° C. for an hour to thoroughly drive out hydrogen therefrom to form dangling bonds in high density. A 100 nm thick $SiO_2$ film was then deposited on the resulting product by RF sputtering to obtain a structure shown in FIG. 10(A). A silicon oxide mask 105 was left over only on channel portions.

Figure 10B:
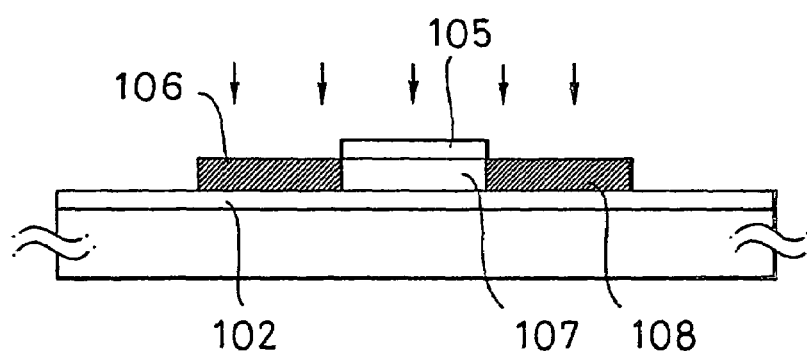

Then, an impurity was doped in the sample according to a process of the present invention using a laser beam in an apparatus as shown in FIG. 6. The sample as shown in FIG. 10(B) was placed in the apparatus, and was heated under $PH_3$ atmosphere having decomposed by the applied electromagnetic energy. To the sample was then irradiated a laser beam to carry out the doping of P (phosphorus). Accordingly, the source and drain regions (106 and 108 in FIG. 10(B)) were rendered N-conductive because P was doped. The channel-forming region (107 in the same figure), however, remained undoped because the silicon oxide mask 105 functions to cut off laser beam irradiation. Accordingly, this channel-forming region was crystallized but remained undoped. It can be seen that a crystallization step and a doping step using a laser beam was conducted at the same time. The doping was carried out under the same conditions as those used in Example 2.

Figure 10C:
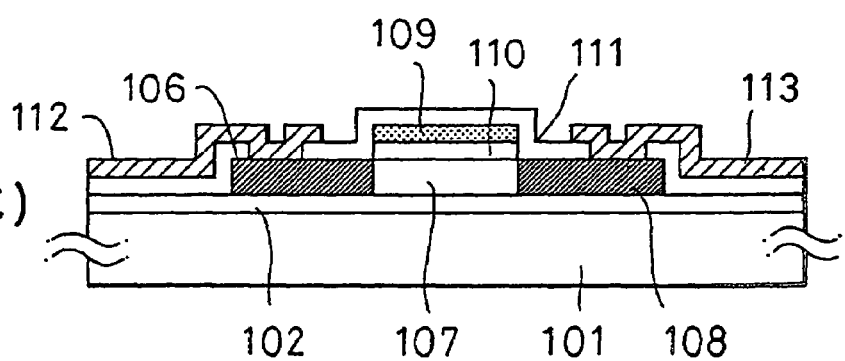

After establishing the source and drain regions above, a gate oxide film 110 and a gate electrode 109 were deposited, and a 100 nm thick $SiO_2$ film 111 was further deposited thereon as an interlayer insulator. Further thereafter, contact holes were patterned, and aluminum was vapor deposited thereon to give a source electrode 112 and a drain electrode 113. Thus was the structure finished into an NTFT as shown in FIG. 10(C) by thermally annealing it in hydrogen at 350° C.

In the process described in the present Example, source and drain cannot be formed in a self-aligned manner. However, the crystallization of the channel region and the doping of the source and drain can be performed simultaneously as in the process of the present Example by, for instance, establishing first a gate electrode on the gate insulator film in the similar manner as in Example 1 and then irradiating a laser beam from the back of the gate insulator film.

EXAMPLE 6

An active matrix as shown in FIG. 11 was fabricated on a Coning 7059 glass substrate. The substrate 201 was a 1.1 mm thick Coning 7059 glass 300×400 mm×1.1 mm in size as shown in FIG. 11(A). The substrate was coated with silicon nitride film 202 by plasma-assisted CVD to a thickness of from 5 to 50 nm, preferably, from 5 to 20 nm, so as to prevent the impurities such as sodium initially present in the substrate from being diffused into the TFT. For technologies forming a blocking layer by coating the substrate with silicon nitride or aluminum oxide, reference should be made to Japanese patent application Hei-3-238710 or Hei-3-238714, filed by the present inventors.

After then depositing a silicon oxide film as a base oxide film 203, a silicon film 204 was deposited by a low-pressure CVD or plasma-assisted CVD process to a thickness of from 30 to 150 nm, preferably from 30 to 50 nm. A silicon oxide film was deposited further thereon as a gate insulator film 205 using tetraethoxysilane (TEOS) as the starting material, by a plasma-assisted CVD process in oxygen atmosphere to a thickness of from 70 to 120 nm, typically, to a thickness of 100 nm. The substrate was maintained throughout to a temperature of 400° C. or lower, preferably, in the temperature range of from 200 to 350° C. to prevent shrinking or warping from occurring on the glass substrate. However, in this temperature level, the oxide film suffered formation of a large number of recombination centers therein to give, for example, an interface level density of $10^{12}$ cm$^{-2}$ or higher. Thus, it was found unfeasible to use the oxide film as a gate insulator.

Figure 11A:
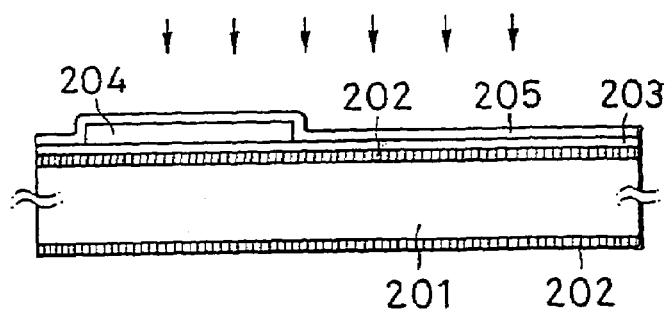
FIGS. 11(A)–(E) show schematically the steps of a process for fabricating a TFT as in Examples 6 and 7.

Accordingly, the structure was subjected to a KrF laser irradiation in a hydrogen-diluted phosphine (5% $PH_3$) atmosphere as shown in FIG. 11(A) to have the crystallinity of the silicon film 204 improved and also to have the quantity of the recombination centers (trap centers) of the gate oxide film 205 reduced. The laser was operated at a beam energy density of from 200 to 300 mJ/cm$^2$, and at a pulse repetition of 10 shots. Preferably, the temperature is maintained in the range of from 200 to 400° C., representatively, at 300° C. As a result, the silicon film 204 was improved in crystallinity, and the gate oxide film 205 was found to contain doped phosphorus at a density of from $1\times10^{20}$ to $3\times10^{20}$ cm$^{-3}$ and to have a reduced interface level density of $10^{11}$ cm$^{-2}$ or lower.

Figure 11B:
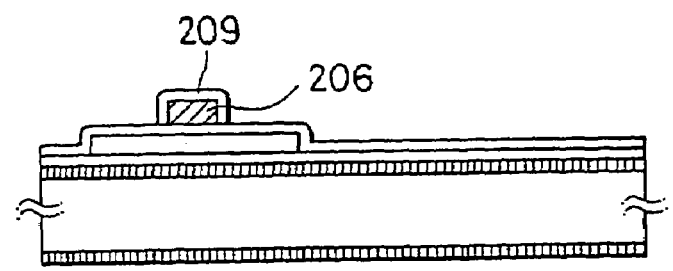

Then, an aluminum gate electrode 206 was deposited on the resulting product to give a structure as shown in FIG. 11(B), and the periphery thereof was further coated with an anodically oxidized product 207.

Then, boron, an impurity for imparting P-conductivity, was implanted in a self-aligned manner into the silicon layer by an ion doping process to give a source and a drain 208 and 209 of the TFT, followed by the irradiation of a KrF laser to recover for the damage given to the silicon film during the ion doping. For this purpose, the laser beam was irradiated at a relatively high energy density of from 250 to 300 mJ/cm$^2$. The resulting source and drain yielded a sheet resistance of from 300 to 800 Ω/cm$^2$.

Figure 11C:
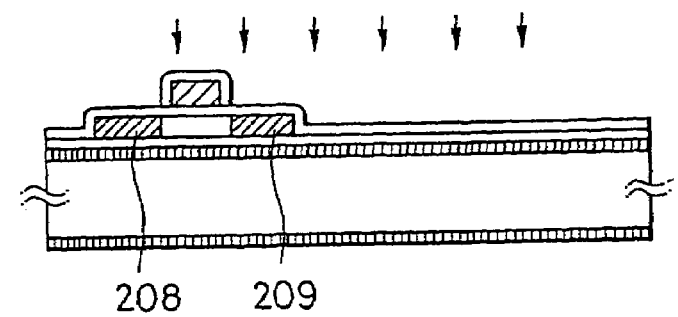
Figure 11D:
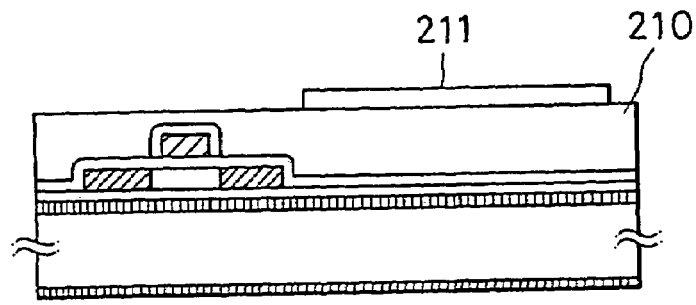
Figure 11E:
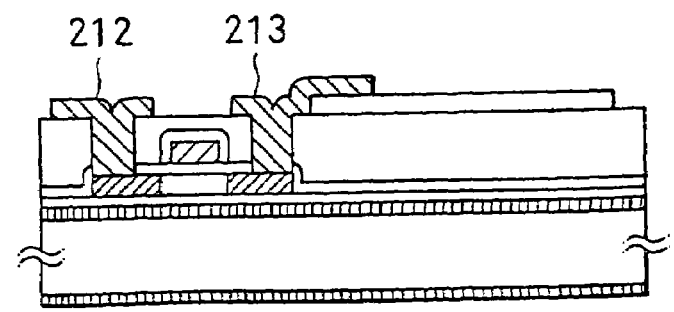

As shown in FIG. 11(D), an interlayer insulator 210 was provided using polyimide, and a pixel electrode 211 was established thereon using ITO (indium-tin-oxide). Furthermore, as shown in FIG. 11(E), contact holes were bore to provide chromium electrodes 212 and 213 on the source and drain regions of the TFT. One of the electrodes, the electrode 213, was further connected to the ITO electrode. Thus, the structure was finished into a pixel for a liquid crystal display device by annealing the resulting product in hydrogen at 300° C. for 2 hours.

EXAMPLE 7

A TFT was fabricated by doping of phosphorus into a silicon oxide film to give a gate insulator film as in Example 6. Similar to the process employed in Example 6, a silicon nitride film 202 was deposited over the whole surface of a substrate 201 by plasma-assisted CVD, to a thickness of from 5 to 50 nm, preferably, from 5 to 20 nm. Then, after depositing a silicon oxide film as the base oxide film 203, a silicon film 204 was deposited by a low-pressure CVD or plasma-assisted CVD process to a thickness of from 30 to 150 nm, preferably from 30 to 50 nm. A silicon oxide film was deposited further thereon as a gate insulator film 205 by sputtering to a thickness of from 70 to 120 nm, typically, to a thickness of 100 nm. Alternatively, this step may be performed using tetraethoxysilane (TEOS) as the starting material, by a plasma-assisted CVD process in oxygen atmosphere as in Example 6. The substrate was maintained throughout to a temperature of 400° C. or lower, preferably, in the temperature range of from 200 to 350° C. to prevent shrinking or warping from occurring on the glass substrate.

Then, the structure was subjected to a KrF laser irradiation in a hydrogen-diluted phosphine (5% $PH_3$) atmosphere as shown in FIG. 11(A) to have the crystallinity of the silicon film 204 improved and also to have the quantity of the recombination centers (trap centers) of the gate oxide film 205 reduced. The laser was operated at a beam energy density of from 200 to 300 mJ/cm$^2$, and at a pulse repetition of 10 shots. The substrate was maintained at room temperature during the process. Accordingly, the doped phosphorus was confined within a region at a depth from the surface of 70% or less of the total thickness of the layer.

An aluminum gate electrode 206 was then deposited on the resulting product to give a structure as shown in FIG. 11(B), and the periphery thereof was further coated with an oxide 207 obtained by anodic oxidation. Upon completion of the anodic oxidation, a negative voltage was inversely applied to the resulting product. More specifically, a voltage in the range of from −100 to −200V was applied for a duration of from 0.1 to 5 hours. The substrate was maintained in the temperature range of, preferably, from 100 to 250° C., and representatively, at 150° C. By carrying out this process, the movable ions which were present in silicon oxide or in the interface between silicon oxide and silicon were attracted to the gate electrode A1, and were trapped in the midway by the region containing phosphorus at a high concentration. Assumably, these phosphorus-rich regions are present as phosphosilicate glass. For details on this technique comprising applying a negative voltage to the gate electrode during or after the anodic oxidation process, reference should be made to Hei-4-115503, filed by the present inventors on Apr. 7, 1992.

Then, phosphorus, an impurity for imparting N-conductivity, was implanted in a self-aligned manner into the silicon layer by a known ion doping process to give a source and a drain 208 and 209 of the TFT, followed by the irradiation of a KrF laser as in FIG. 11(C), to recover for the damage given to the silicon film during the ion doping. As shown in FIG. 11(D), an interlayer insulator 210 was provided using polyimide, and a pixel electrode 211 was established thereon using ITO (indium-tin-oxide). Furthermore, as shown in FIG. 11(E), contact holes were bore to provide chromium electrodes 212 and 213 on the source and drain regions of the TFT. One of the electrodes, the electrode 213, was further connected to the ITO electrode. Finally, a TFT was obtained after annealing the resulting product in hydrogen at 300° C. for 2 hours.

EXAMPLE 8

A MOS (metal-oxide semiconductor) capacitor was fabricated by using a gate oxide film having prepared by laser doping a silicon oxide film on a single crystal substrate with phosphorus. The C-V characteristic curve of this MOS capacitor was obtained.

A silicon oxide film was deposited as a gate insulator film on a (100) plane of single crystal silicon, to a thickness of from 70 to 120 nm, typically to a thickness of 100 nm, by plasma-assisted CVD using tetraethoxysilane (TEOS) as a starting material in an oxygen atmosphere. The substrate was maintained at a temperature of 400° C. or lower, preferably, in the temperature range of from 200 to 350° C. However, in this temperature level, the oxide film was found to contain a large number of clusters containing carbon, and it also suffered formation of a considerable number of recombination centers to give, for example, an interface level density of $10^{12}$ cm$^{-2}$ or higher. Thus, it was found unfeasible to use the oxide film as a gate insulator.

Accordingly, the structure was subjected to a KrF laser irradiation in a hydrogen-diluted phosphine (5% $PH_3$) atmosphere in the same apparatus as used in FIG. 1 to have the quantity of the recombination centers (trap centers) of the silicon oxide film reduced. The laser was operated at a beam energy density of from 200 to 300 mJ/cm$^2$, and at a pulse repetition of 10 shots. Preferably, the temperature is maintained in the range of from 200 to 400° C., representatively, at 300° C. As a result, the oxide film was found to contain doped phosphorus at a density of from $1\times10^{20}$ to $3\times10^{20}$ cm$^{-3}$ and to have a reduced interface level density of $10^{11}$ cm$^{-2}$ or lower. Then, an aluminum gate electrode was deposited thereon.

Figure 12A:
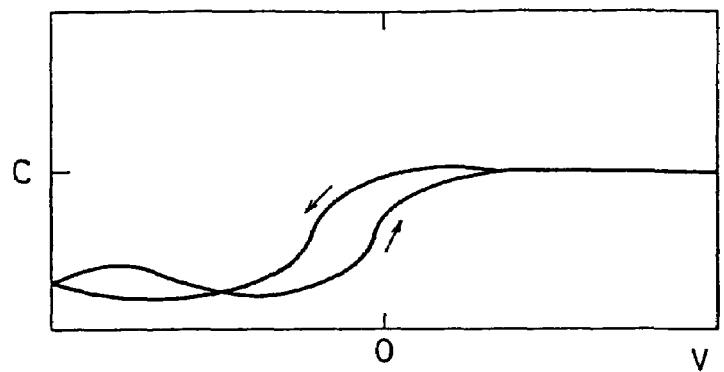
FIGS. 12(A)–(C) are graphs showing the C-V characteristics of a TFT having fabricated in an Example.
Figure 12B:
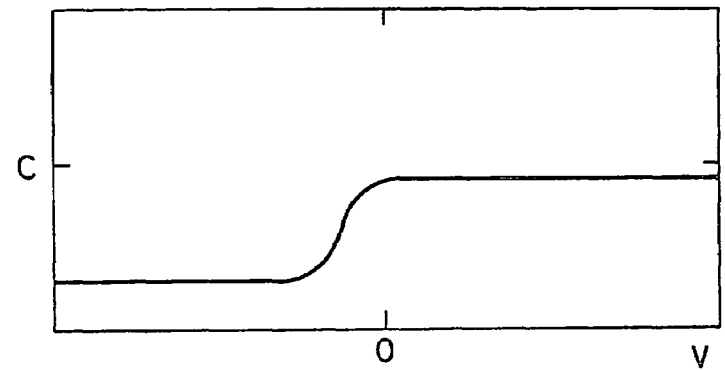

A MOS capacitor fabricated without performing the laser doping process yields, for example, a C-V curve having a large hysteresis as shown in FIG. 12(A). In the figure, the abscissa is the voltage and the ordinate is the electrostatic capacity. A MOS capacitor subjected to a laser doping treatment according to the present invention yields a favorable C-V curve as shown in FIG. 12(B), which is in sharp contrast with the C-V curve of FIG. 12(A).

Figure 12C:
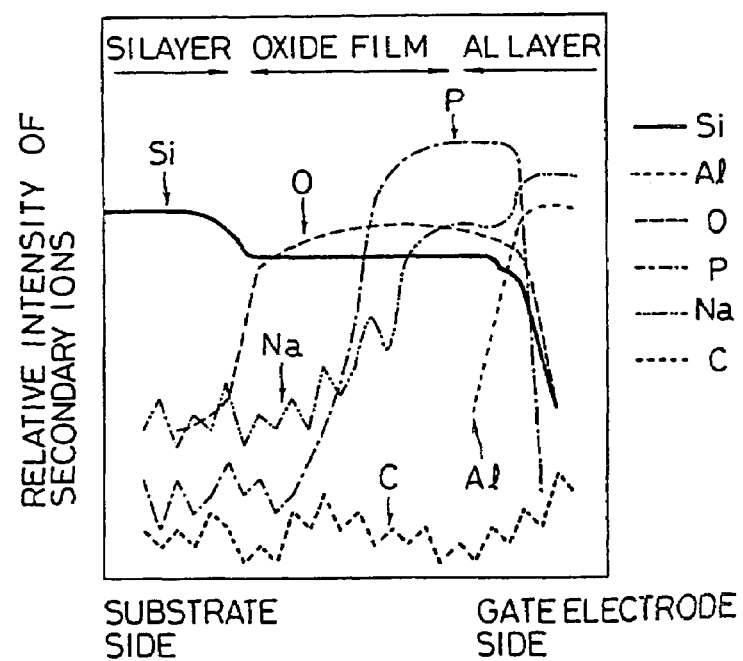

The film thus obtained by the process according to the present invention contains each of the elements distributed in the film in a manner as shown in FIG. 12(C). It can be seen that the silicon oxide film having subjected to laser doping according to the present invention is doped with phosphorus to about a half of the total depth of the film, and that gettering was effected on sodium atoms thereby. It can be seen also that little or no carbon is present over the whole oxide film. This is because carbon was driven out from the film by laser irradiation. It is further effective to apply a negative voltage to the aluminum gate electrode as in Example 7, because the movable ions such as sodium ions present in the film can be attracted to the phosphorus-rich regions.

EXAMPLE 9

A 500 nm thick amorphous silicon film provided on a glass substrate was doped with an impurity by a process according to the present invention, and the film characteristics thereof were obtained. The results are given in FIGS. 13 to 15. The laser used in this Example was a KrF laser emitting a beam at a wavelength of 248 nm. The chamber used in the present process was like the one shown in FIG. 5. It was attempted in this Example to change the doped impurity by introducing different types of gases into the chamber. More specifically, a hydrogen gas containing 5% phosphine was supplied to the chamber during the laser irradiation to add an impurity which imparts N-conductivity to the semiconductor, and a hydrogen gas containing 5% diborane was introduced to the chamber during the laser irradiation to render the semiconductor P-conductive by doping of the impurity.

The chamber was maintained at a pressure of 100 Pa. The laser was irradiated at an energy density of from 190 to 340 mJ/cm$^2$, and the pulse was provided at a repetition of from 1 to 100 shots. The temperature of the substrate was maintained at room temperature (R.T.) or at 300° C.

Figure 13:
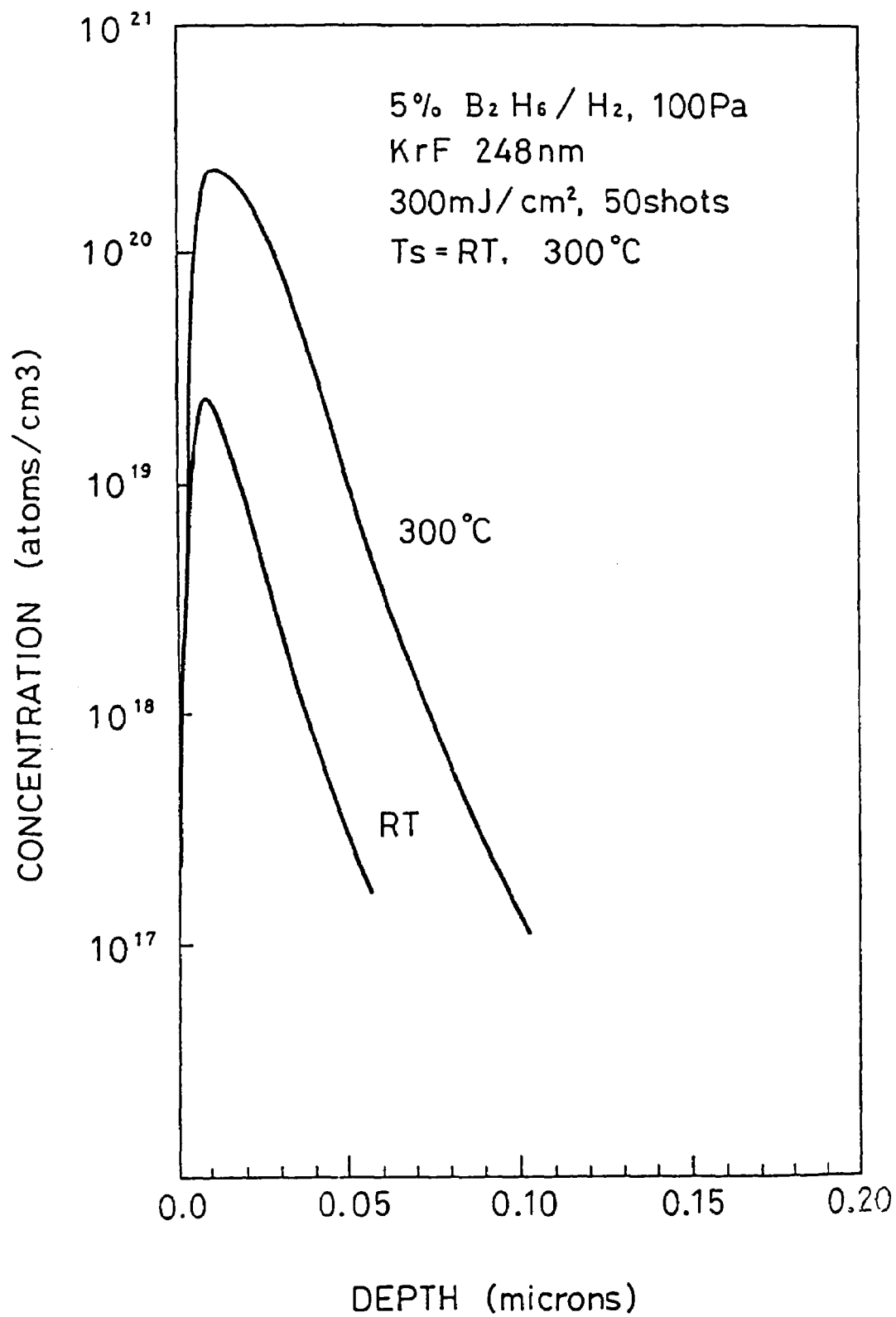
FIG. 13 is a graph showing the distribution of an impurity (boron) along the thickness direction.
Figure 14:
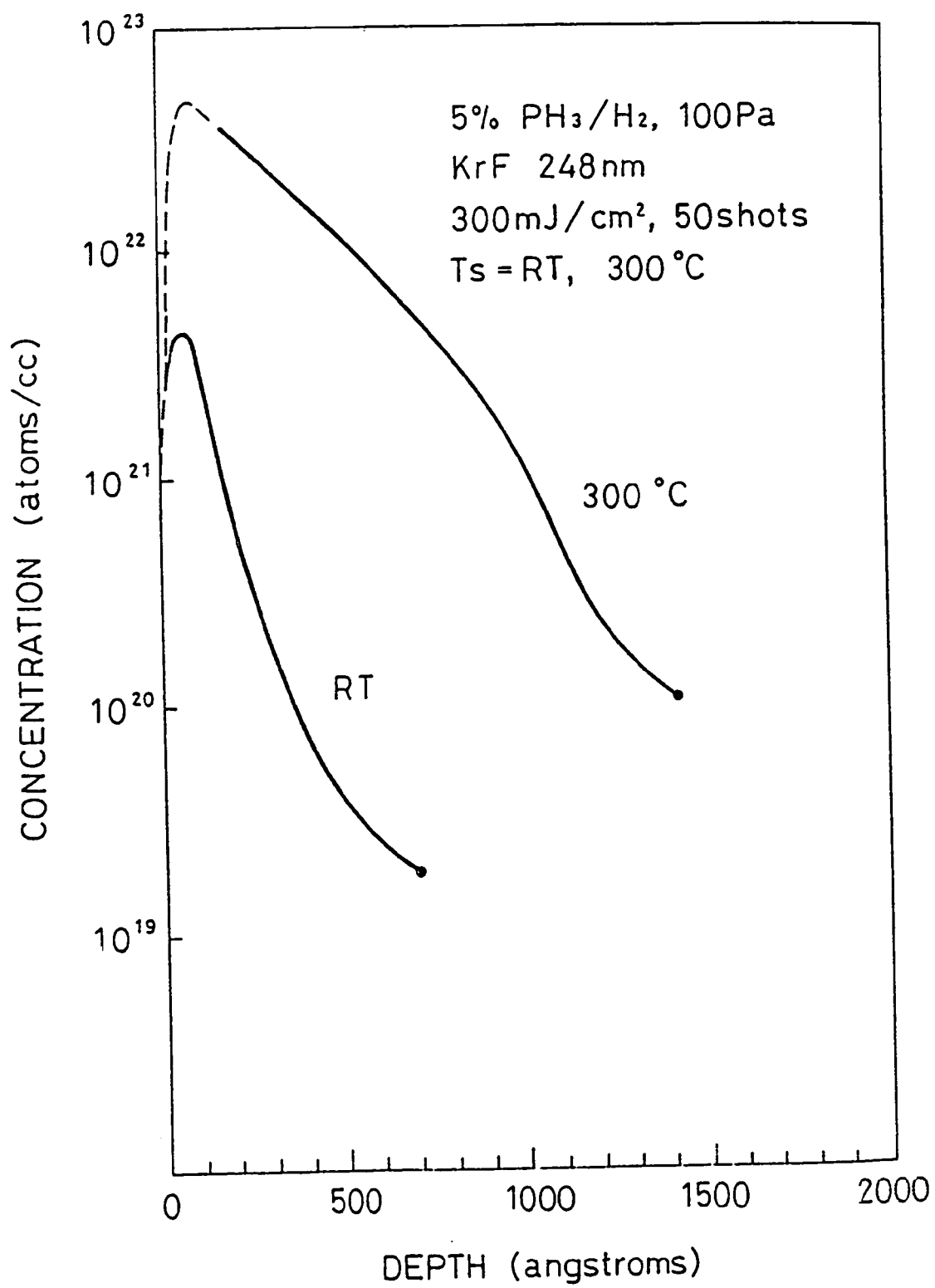
FIG. 14 is a graph showing the distribution of an impurity (phosphorus) along the thickness direction.

In FIGS. 13 and 14 are shown the change in diffusion of the impurities with varying substrate temperatures. In this case, the laser was operated at an energy density of 300 mJ/cm$^2$ and at a pulse repetition of 50 shots. FIG. 13 was obtained from the data collected by secondary ion mass spectroscopy (SIMS), and it shows how boron diffuses along the depth direction. As is clearly read from this figure, the impurity concentration was an order of magnitude higher for the sample provided at a substrate temperature of 300° C., as compared with that of a sample maintained at a substrate temperature of R.T.; also, the diffusion depth for the former was about twice as large as that of the latter.

In FIG. 14 is shown the distribution of phosphorus along the depth direction of the sample. A similar tendency as in the case of the distribution of boron was observed. The effect of heating the substrate was particularly prominent in the case of adding phosphorus.

In FIG. 15 are plotted the sheet resistances with varying laser energy density and number of shots. Boron was doped as the impurity. As the figure clearly reads, the sheet resistance decreases and the impurity concentration increases with increasing energy density. However, the sheet resistance seems to converge on a constant value.

Furthermore, despite the sheet resistance was observed to decrease with increasing number of shots, no considerable decrease in sheet resistance was observed at a laser energy density of 220 mJ/cm$^2$ or higher in both cases of 50 shots and 100 shots. However, there was observed a great difference between the sheet resistances obtained for 1 shot and 5 shots. Accordingly, it was confirmed that the laser pulses at least 5 shots are necessary to achieve a stable laser irradiation.

As described in the foregoing, a semiconductor can be efficiently doped with an impurity which imparts either an N-conductivity or P-conductivity to the doped product by the process according to the present invention, said process comprising irradiating a laser beam to the semiconductor in an atmosphere containing the impurity above while heating the sample or while applying an electromagnetic energy to a reactive gas to decompose it into an atmosphere containing the impurity above. In particular, the process according to the present invention is effective in that the doping can be conducted without damaging the glass substrate, yet without being influenced by the wavelength of the laser used and by the type of the doping gas used in the process.

Furthermore, as mentioned earlier, the present invention is industrially valuable because it not only is confined to the field of doping semiconductors with impurities, but also is applicable to a variety of fields, such as the surface modification of metal and ceramic materials and the addition of trace elements into thin films of metal, ceramics, and insulators.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device comprising steps of:
   irradiating a surface of a semiconductor with a line-shaped laser beam in a gas atmosphere containing an impurity;
   applying an electromagnetic energy to the gas atmosphere so as to decompose the gas atmosphere containing the impurity while irradiating the surface with the line-shaped laser beam;
   changing a relative position of the semiconductor with respect to the line-shaped laser beam while irradiating the surface with the line-shaped laser beam; and
   heating the semiconductor at a temperature not higher than a crystallization temperature of said semiconductor while applying the electromagnetic energy.

2. The method according to claim 1 wherein the gas atmosphere comprises a gas selected from the group consisting of $AsH_3$, $PH_3$, $BF_3$, $BCl_3$ and $B(CH_3)_3$.

3. The method according to claim 1 wherein said semiconductor device includes a thin film transistor.

4. The method according to claim 1 wherein the semiconductor is moved with respect to the line-shaped laser beam.

5. A method of manufacturing a semiconductor device comprising steps of:
   disposing a substrate in a chamber, said substrate having a semiconductor film comprising silicon formed thereon;
   introducing a gas containing an impurity into the chamber;
   irradiating the semiconductor film with a laser light through a window having a slit shape while changing a relative position of the substrate with respect to the laser light so that the impurity is introduced into the semiconductor film; and
   heating the semiconductor film during a laser light irradiation.

6. The method of claim 5 wherein the semiconductor film is heated not lower than 200 degree C.

7. The method according to claim 5 wherein said semiconductor device includes a thin film transistor.

8. The method according to claim 5 wherein the substrate is moved with respect to the laser light.

9. A method of manufacturing a semiconductor device comprising steps of:
   disposing a substrate in a chamber, said substrate having a semiconductor film comprising silicon formed thereon;
   introducing a gas containing an impurity into the chamber;
   applying an electromagnetic energy to the gas in the chamber in order to activate the gas; and
   irradiating the semiconductor film with a laser light through a window having a slit shape so that the impurity is introduced into the irradiated portion of the semiconductor film; and
   changing a relative position of the substrate with respect to the laser light while irradiating the semiconductor film with the laser light.

10. The method according to claim 9 further comprising heating the semiconductor film during the irradiation of the laser light.

11. The method according to claim 9 wherein said semiconductor device includes a thin film transistor.

12. The method according to claim 9 wherein the substrate is moved with respect to the laser light.

13. A method of manufacturing a semiconductor device comprising steps of:
   holding a semiconductor in a chamber;
   introducing a gas containing an impurity into the chamber;
   producing a plasma of said gas by applying an electromagnetic energy;
   introducing said impurity from said plasma into an entirety of a line-shaped target portion of said semiconductor;
   changing a relative position of the line-shaped target portion with respect to said semiconductor in said chamber; and heating the semiconductor at a temperature not higher than a crystallization temperature of said semiconductor while applying the electromagnetic energy.

14. The method according to claim 13 wherein said gas is selected from the group consisting of $PH_3$ and $B_2H_6$.

15. The method according to claim 13 wherein said gas is selected from the group consisting of $AsH_3$, $PH_3$, $BF_3$, $BCl_3$, and $B(CH_3)_3$.

16. The method according to claim 13 wherein said semiconductor device includes a thin film transistor.

17. A method of manufacturing a semiconductor device comprising steps of:
producing a plasma of a gas by applying an electromagnetic energy, wherein said gas contains an impurity;
introducing said impurity from said plasma into an entirety of a line-shaped target portion of a semiconductor film;
changing a relative position of the line-shaped target portion with respect to the semiconductor film; and
heating the semiconductor film at a temperature not higher than a crystallization temperature of said semiconductor film while applying the electromagnetic energy.

18. The method according to claim 17 wherein said gas is selected from the group consisting of $PH_3$ and $B_2H_6$.

19. The method according to claim 17 wherein said gas is selected from the group consisting of $AsH_3$, $PH_3$, $BF_3$, $BCl_3$, and $B(CH_3)_3$.

20. The method according to claim 17 wherein said semiconductor device includes a thin film transistor.

* * * * *